(12) United States Patent
Weber et al.

(10) Patent No.: US 11,088,275 B2
(45) Date of Patent: Aug. 10, 2021

(54) METHOD FOR OPERATING A SUPERJUNCTION TRANSISTOR DEVICE

(71) Applicant: Infineon Technologies Austria AG, Villach (AT)

(72) Inventors: Hans Weber, Bayerisch Gmain (DE); Christian Fachmann, Fuernitz (AT); Franz Hirler, Isen (DE); Matteo-Alessandro Kutschak, Ludmannsdorf (AT); Andreas Riegler, Lichtpold (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/811,492

(22) Filed: Mar. 6, 2020

(65) Prior Publication Data
US 2020/0287535 A1    Sep. 10, 2020

(30) Foreign Application Priority Data
Mar. 8, 2019   (EP) .................................... 19161485

(51) Int. Cl.
*H01L 29/78* (2006.01)
*H01L 29/06* (2006.01)
*H01L 29/40* (2006.01)

(52) U.S. Cl.
CPC ...... *H01L 29/7813* (2013.01); *H01L 29/0634* (2013.01); *H01L 29/407* (2013.01)

(58) Field of Classification Search
CPC ....... H01L 29/08–0895; H01L 29/0634; H01L 29/10–1095; H01L 29/7802–7826; H01L 29/80–8128
See application file for complete search history.

(56) References Cited

U.S. PATENT DOCUMENTS

| | | |
|---|---|---|
| 2007/0267690 A1* | 11/2007 | Yu .................. H01L 29/7393 257/327 |
| 2015/0108620 A1 | 4/2015 | Weber |
| 2015/0179633 A1 | 6/2015 | Mauder et al. |
| 2016/0006353 A1 | 1/2016 | Hirler et al. |
| 2020/0091300 A1* | 3/2020 | Hirler ............... H01L 29/7802 |

* cited by examiner

*Primary Examiner* — Thomas J. Hiltunen
(74) *Attorney, Agent, or Firm* — Murphy, Bilak & Homiller, PLLC

(57) ABSTRACT

A method for operating a superjunction transistor device and a transistor arrangement are disclosed. The method includes operating the superjunction transistor device in a diode state. Operating the superjunction transistor device in the diode state includes applying a bias voltage different from zero between a drift region of at least one transistor cell of the superjunction transistor device and a compensation region of a doping type complementary to a doping type of the drift region. The compensation region adjoins the drift region, and a polarity of the bias voltage is such that a pn-junction between the drift region and the compensation region is reverse biased.

20 Claims, 17 Drawing Sheets

METHOD FOR OPERATING A SUPERJUNCTION TRANSISTOR DEVICE

TECHNICAL FIELD

This disclosure relates in general to a method for operating a transistor device, in particular for operating a superjunction transistor device as an active rectifier.

BACKGROUND

Various kinds of electronic circuits include a rectifier element. In switched-mode power converters (buck converters, boost converters, flyback converters, resonant converters, etc.) or drive circuits for driving an inductive load (motor, magnetic valve, etc.) a rectifier element may be used to allow an inductor to commutate. In many applications, a MOSFET is used as an active rectifier element, which may also be referred to as synchronous rectifier element. Operating a MOSFET as a synchronous rectifier may include switching on the MOSFET when a voltage across the MOSFET has a first polarity so that the MOSFET operates in a forward conducting state, switching off the MOSFET before the polarity of the voltage changes to a second polarity opposite the first polarity, and operating the MOSFET in a diode state when the voltage across the MOSFET has the second polarity. The MOSFET operates in the diode state when an internal body diode is forward biased and the MOSFET is switched off.

When the MOSFET operates in the diode state, there is a charge carrier plasma including both n-type charge carriers (electrons) and p-type charge carriers (holes) in a drift region of the MOSFET. When the polarity of the voltage across the MOSFET changes such that the body diode is reverse biased these charge carriers have to be removed before the MOSFET blocks. Removing these injected charge carriers is associated with losses (which are sometimes referred to Qinj-losses). Further, when the charge carriers forming the plasma have been removed, so that the MOSFET blocks, and as the voltage across the blocking MOSFET increases a depletion region (space charge regions) is formed in the drift region. Forming this depletion region is associated with the ionization of dopant atoms in the drift region and the body region and, therefore, a storing of charge carriers in the drift and body region. In a superjunction device, the depletion region also expands in a compensation region that adjoins the drift region and has a doping type complementary to a doping type of the drift region. Charging the drift and body region and the compensation region of a superjunction device is associated with losses (which are sometimes referred to as Qoss-losses) wherein the higher the amount of charge carriers that are stored in the device and/or the higher the voltage level of the voltage that reverse biases the body diode the higher these losses. The overall losses that are associated with commutating the MOSFET from the diode state to the blocking state are sometimes referred to as reverse recovery losses (Qrr-losses).

In a superjunction MOSFET, losses associated with commutating the device from the diode state to the blocking state are particularly high so that a superjunction MOSFET is not considered suitable as a rectifier. There is a need for reducing reverse recovery losses in a superjunction transistor device such as a superjunction MOSFET.

SUMMARY

One example relates to a method. The method includes operating a superjunction transistor device in a diode state, wherein operating the superjunction transistor device in the diode state includes applying a bias voltage different from zero between a drift region of at least one transistor cell of the transistor device and a compensation region of a doping type complementary to a doping type of the drift region, wherein the compensation region adjoins the drift region, and wherein a polarity of the bias voltage is such that a pn-junction between the drift region and the compensation region is reverse biased.

Another example relates to a transistor arrangement. The transistor arrangement includes a transistor device having a bias region coupled to a bias node and at least one transistor cell including a source region, a body region, and drift region, and a first electronic switch connected between the bias region and the bias node (Q), wherein the transistor device and the first electronic switch are integrated in a common semiconductor body.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
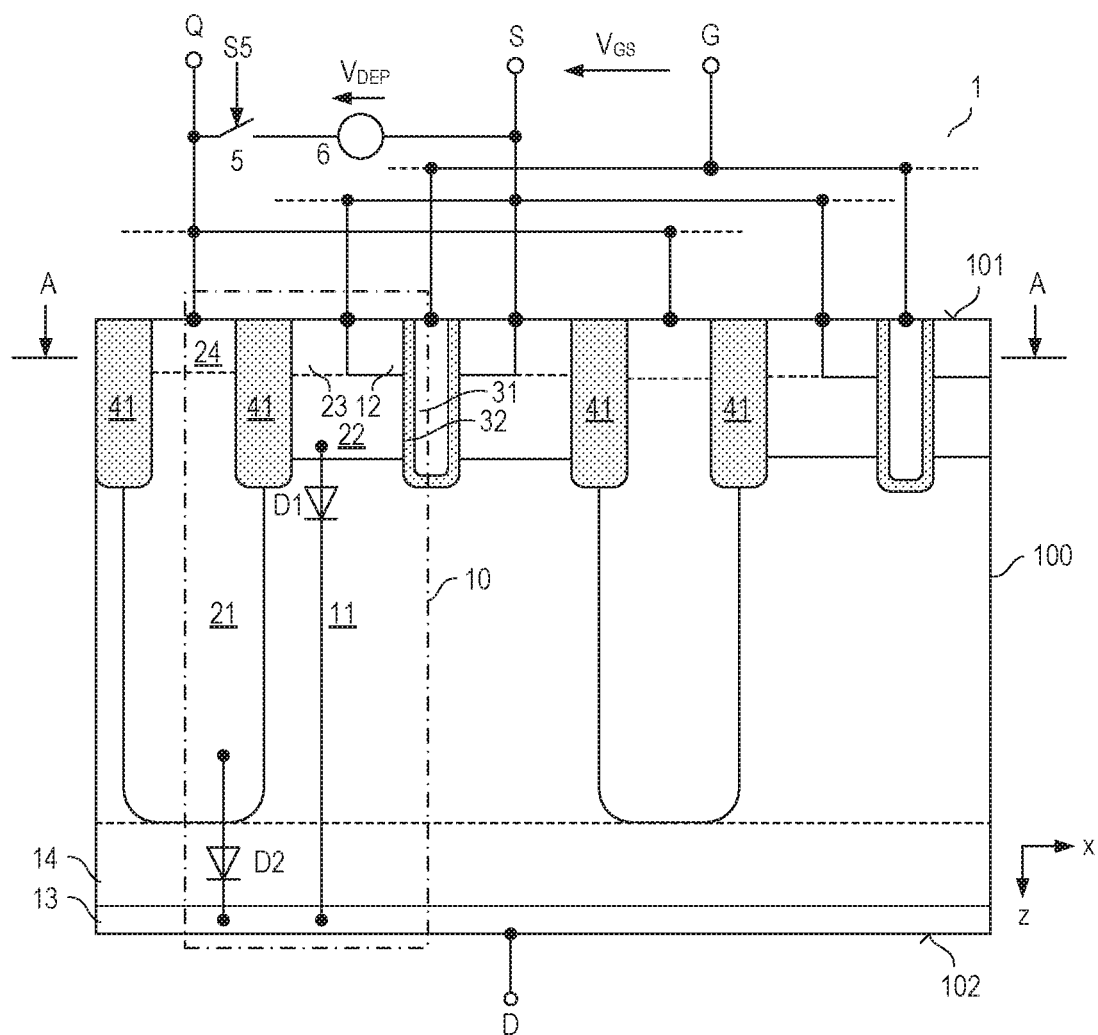
FIG. 1 shows a transistor arrangement with a superjunction transistor device according to one example.

FIG. 1 schematically illustrates a transistor arrangement 1 with a transistor device. More specifically, FIG. 1 shows a vertical cross-sectional view of one example of the transistor device and circuit symbols of further devices of the transistor arrangement. The transistor device includes a semiconductor body 100 with a first surface 101 and a second surface 102 opposite the first surface 101. The second surface 102 is spaced apart from the first surface 101 in a vertical direction z of the semiconductor body 100. The "vertical direction z" is a direction perpendicular to the first and second surface 101, 102. According to one example, the semiconductor body 100 includes a monocrystalline semiconductor material. Examples of the monocrystalline semiconductor material include, but are not restricted to, silicon (Si), silicon carbide (SiC), gallium arsenide (GaAs), gallium nitride (GaN), or the like.

Referring to FIG. 1, the transistor device includes a plurality of transistor cells 10 (wherein the outline of these transistor cells is illustrated by a dashed and dotted line in FIG. 1). Each of these transistor cells 10 includes a drift region 11 of a first doping type (first conductivity type), a source region 12 of the first doping type and a body region 22 of a second doping type (second conductivity type) complementary to the first doping type. The body region 22 separates the source region 12 from the drift region 11. Further, the body region 22 adjoins the drift region 11 so that a pn-junction is formed between the body region 22 and the drift region 11. Further, a gate electrode 31 is arranged adjacent the body region 22 and is dielectrically insulated from the body region 22 by a gate dielectric 32. The gate electrode 32 serves to control a conducting channel in the body region 22 along the gate dielectric 32 between the source region 12 and the drift region 11. Each transistor cell 10 further includes a drain region 13 of the first doping type. The drain region 13 is spaced apart from the body region 22 in a current flow direction of the transistor device and is separated from the body region 22 by the drift region 11. In the transistor device shown in FIG. 1, the current flow direction equals is the vertical direction of the semiconductor body 100. According to one example (illustrated in dashed lines in FIG. 1), a buffer region 14 of the first doping type is arranged between the drain region 13 and the drift region 11. The buffer region 14 has a lower doping concentration than the drift region 11, for example.

Referring to FIG. 1, the transistor device may be implemented as a superjunction transistor device. In this case, each transistor cell 10 further includes a compensation region 21 of the second doping type that adjoins the drift region 11 and is separated from the body region 22. In the example illustrated in FIG. 1, the compensation region 21 of each transistor cell is separated from the respective body region 22 (and the respective source region 12) by an insulation region 41 that is electrically insulating. Referring to FIG. 1, the insulation region 41 may also separate the compensation region 21 from a section of the drift region 11 that adjoins the body region 22. According to one example, the insulation region 41 includes an oxide, a nitride, or the like. In the example illustrated in FIG. 1, the source and body regions 22, 12 of the transistor cells 10 are arranged close to the first surface 101 of the semiconductor body 100. In this example, the insulation region 41 is located in a trench that extends from the first surface 101 into the semiconductor body 100. In the vertical direction, the insulation region 41 extends beyond a pn-junction between the body region 22 and the drift region 11 in order to completely separate the body regions 22 from the respective compensation regions 21.

According to one example, the semiconductor body 100 includes monocrystalline silicon and the individual active device regions are implemented such that a respective doping concentration is in a range as outlined in the following: drift region 11: between $1E15\ cm^{-3}$ and $1E17\ cm^{-3}$; compensation region 21: between $1E15\ cm^{-3}$ and $1E17\ cm^{-3}$; body region 22: between $1E17\ cm^{-3}$ and $1E18\ cm^{-3}$; source region 12: between $1E18\ cm^{-3}$ and $1E21\ cm^{-3}$; drain region 13: between $1E18\ cm^{-3}$ and $1E21\ cm^{-3}$; optional buffer region 14: between $5E14\ cm^{-3}$ and $5E16\ cm^{-3}$.

Referring to FIG. 1, the gate electrodes 31 of two neighboring transistor cells 10 can be formed by one electrode, the drift region 11 of two neighboring transistor cells 10 can be formed by one contiguous semiconductor region, the compensation region 21 of two neighboring transistor cells can be formed by one contiguous semiconductor region, and the drain region 13 (as well as the buffer region 14) of each of the transistor cells 10 can be formed by one contiguous semiconductor region. The transistor cells 10 are connected in parallel in that the gate electrodes 31 of the transistor cells 10 are connected to a gate node G, the source regions 12 and the body regions 22 of the transistor cells 10 are connected to a source node S, and the one or more drain regions 13 are connected to a drain node D. The gate node G, the source node S and the drain node D are only schematically illustrated in FIG. 1. Further, connections between the gate node G and the gate electrodes 31 and between the source node S and the drain node D and the respective active device regions (source regions 12, body regions 22, and drain regions 13) are only schematically illustrated in FIG. 1. These connections may include metallizations (not shown) on top of the first and second surfaces 101, 102.

Referring to the above, the body regions 22 of the transistor cells 10 are connected to the source node S. According to one example, the body region 22 includes a contact region 23 of the second doping type, wherein the contact region 23 is more highly doped than remaining sections of the body region 22. In particular, the contact region 23 is more highly doped than those sections of the body region 22 adjoining the gate dielectric 32. The contact region 23 may serve to provide an ohmic contact between the source node S and the respective body region 22, more specifically, between the body region 22 and a source metallization (not illustrated).

Referring to FIG. 1, the transistor device further includes a circuit node Q, which is referred to as bias node in the following. The bias node Q, which is different from the source node, serves to apply a voltage $V_{DEP}$ between the compensation region 21 and the drift region 11 such that a pn-junction between the compensation region 21 and the drift region 11 is reverse biased when the transistor device is in a diode state (which is explained in detail herein further below).

In the example illustrated in FIG. 1, the compensation regions 21 are coupled to the bias node Q. According to one example, each of the compensation regions 21 includes a contact region 24 (illustrated in dashed lines in FIG. 1) of the second doping type, wherein the contact region 24 is connected to the bias node Q. The contact regions 24 provide for an ohmic contact between the compensation regions 21 and the bias node Q.

Applying the bias voltage $V_{DEP}$ between the compensation region 21 and the drift region 11 may include applying the bias voltage $V_{DEP}$ between the compensation region 21 and the body region 22, wherein a polarity of the bias voltage $V_{DEP}$ is such that the pn-junction between the body region 22 and the drift region 11 is forward biased and the pn-junction between the drift region 11 and the compensation region 21 is reverse biased. Referring to FIG. 1, the bias voltage $V_{DEP}$ may be applied between the compensation region 21 and the body region 22 by applying the bias voltage $V_{DEP}$ between the bias node Q coupled to the compensation region 21 and the source node S coupled to the body region 22 (and the source region 12). More specifically, the bias voltage $V_{DEP}$ may be applied between the bias node Q and the source node S by coupling a voltage source 6 that is configured to provide the bias voltage $V_{DEP}$ between the bias node Q and the source node S.

Optionally, the bias voltage $V_{DEP}$ is selectively applied between the drift region 11 and the compensation region 21. This may be achieved by connecting a first switch 5 in series with the voltage source 6. The first switch 5 is connected between the voltage source 6 and the bias node Q in the example shown in FIG. 1. This, however, is only an example. The switch 5 may be implemented at any position between the voltage source 6 and the body region 22 or between the voltage source 6 and the compensation region 21. Some examples for implementing the first switch are explained herein further below.

Figure 2:
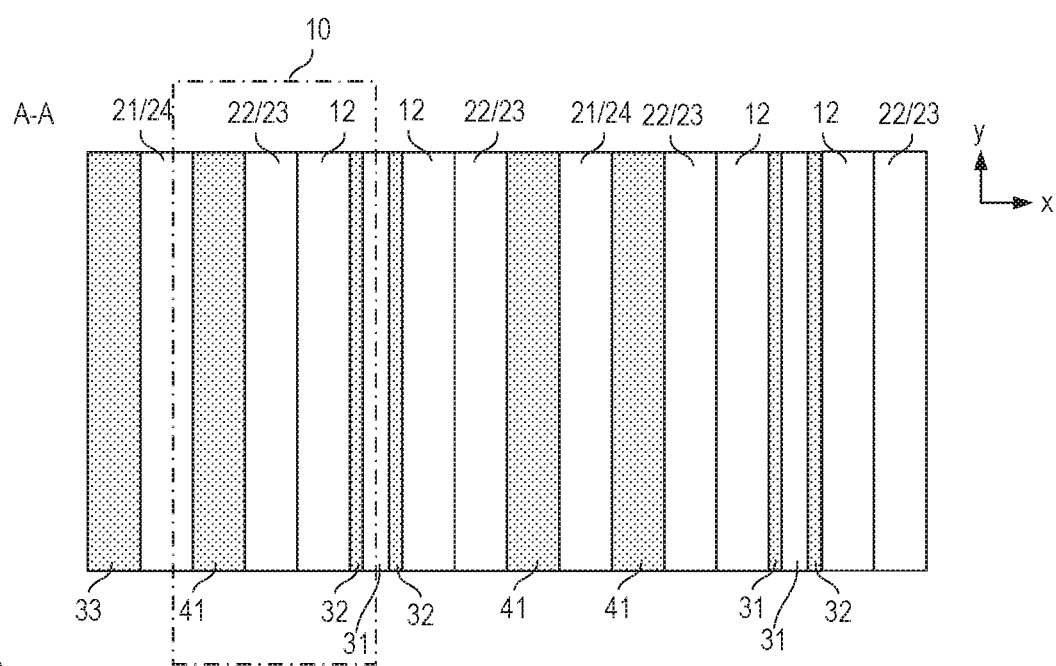
FIG. 2 shows a horizontal cross-sectional view of one example of a superjunction transistor device of the type shown in FIG. 1.

According to one example, the transistor cells 10 are elongated in a lateral direction that is perpendicular to the section plane illustrated in FIG. 1. This is illustrated in FIG. 2 that shows a horizontal cross-sectional view of the semiconductor body 100 in a section plane A-A shown in FIG. 1. In the following, a lateral direction x illustrated in FIG. 1 in which the body region 22 is separated from the compensation region 21 by the insulation region 41 or in which the body region 22 is adjacent the gate dielectric 32 is referred to as first lateral direction x in the following. A lateral direction perpendicular to the first lateral direction x is referred to as second lateral direction y. Referring to FIG. 2, the transistor cells 10 are elongated in the second lateral direction y. "Elongated" means, for example, that a dimension of the drift regions 11 or compensation regions 21 in the second lateral direction y is at least one 100 (=1E2) times, or at least one 1000 (=1E3) times, the dimension in the first lateral direction x.

The superjunction transistor device is a transistor device of the first conductivity type because the source region 12, the drift region 11 and the drain region 12 is of the first conductivity type (doping type). The first conductivity type can be an n-type or a p-type. Thus, the superjunction transistor device can be implemented as an n-type transistor device or as a p-type transistor device. In an n-type transistor device, the semiconductor regions of the first doping type are n-type semiconductor regions and the semiconductor regions of the second doping type are p-type semiconductor regions. In a p-type transistor device, the semiconductor regions of the first doping type are p-type semiconductor regions and the semiconductor regions of the second doping type are n-type semiconductor regions. Further, the transistor device can be implemented as an enhancement (normally-off) device or as a depletion (normally-on) device. In an enhancement device, the body regions 22 adjoin the gate dielectric 32. In a depletion device, there is a channel region 15 of the first doping type that extends from the source region 12 to the drift region 11 along the gate dielectric 32 and is arranged between the gate dielectric 32 and the body region 22.

The superjunction transistor device shown in FIG. 1 can be operated in four different operating states:

(a) In a first operating state, the gate electrode 32 in each transistor cell 10 is controlled such that there is a conducting channel in the body region 22 along the gate dielectric 32 between the source region 12 and the drift region 11. In an n-type enhancement transistor device, for example, a conducting channel is generated along the gate dielectric 32 by applying a voltage $V_G S$ (which is referred to as gate-source voltage in the following) between the gate node G and the source node S such that a voltage level of the gate-source voltage is higher than a threshold voltage of the transistor device. The threshold voltage is dependent on the conductivity type of the transistor device and on whether the transistor device is an enhancement device or a depletion device. This is commonly known, so that no further explanation is required in this regard. Further, in the first operating state, a voltage applied between the drain D and the source node S is such that a pn-junction between the drift region 11 and the body region 22 of each transistor cell 10 is reverse biased. In an n-type transistor device, this pn-junction between the drift region 11 and the body region 22 is reverse biased when the voltage between the drain node D and the source node S (which is referred to as drain-source voltage in the following) is a positive voltage. An operating state of a transistor device, such as the superjunction transistor device shown in FIG. 1, in which the pn-junction between the drift region and the body region is reverse biased is usually referred to as forward biased operating state of the transistor device. Thus, the first operating state (in which the transistor device is conducting) is referred to as forward conducting state in the following. In this operating state, a current can flow between the drain node D and the source node S via the drain region 13, the optional buffer region 14, the drift region 11, the channel in the body region 22 along the gate dielectric 32, and the source region 12. In the forward conducting state, the current is a unipolar current. In an n-type transistor device, this current includes electrons as charge carriers.

(b) In a second operating state, the gate-source voltage $V_{GS}$ is such that there is a conducting channel in the body region 22 along the gate dielectric 32. This is equivalent to the first operating state. In the second operating state, however, the drain-source voltage $V_{DS}$ has a polarity opposite the polarity in the first operating state. This second operating state is also referred to as reverse conducting state in the following. In this operating state, the transistor device is basically in a unipolar conducting state. That is, a current can flow between the drain node D and the source node S via the source region 12, the conducting channel in the body region 22, the drift region 11, the optional buffer region 14 and the drain region 13. However, situations may occur in which a voltage across the pn-junction between the body region 22 and the drift region 11 becomes higher than a forward voltage of this pn-junction, so that, in the reverse conducting state, parallel to the conducting channel in the body region 22, a bipolar diode formed by the body region 22, the drift region 11 and the drain region 13 becomes active and a bipolar current sets in. This bipolar diode is represented by the circuit symbol labeled with D1 in FIG. 1.

(c) In a third operating state, the gate-source voltage $V_{GS}$ is such that there is no conducting channel in the body region 22 along the gate dielectric 32. Further, in the third operating state, the transistor device is reverse biased, that is, the polarity of the drain-source voltage $V_{DS}$ is such that the pn-junction between the body region 22 and the drift region 11 is forward biased. This operating state is also referred to as diode state in the following.

(d) In the fourth operating state, the gate-source voltage $V_{GS}$ is such that there is no conducting channel in the body region 22 along the gate dielectric 32. Further, in the fourth operating state, the transistor device is forward biased, that is, a polarity of the drain-source voltage $V_{DS}$ is such that the pn-junction between the body region 22 and the drift region 11 is reverse biased. This operating state is also referred to as blocking state in the following.

In the third operating state (diode state) charge carriers of the first conductivity type are injected by the drain region 13 into the drift region 11 and charge carriers of the second conductivity type are injected by the body region 22 into the drift region 11 so that there is a charge carrier plasma including charge carriers of the first and second conductivity type in the drift region 11. In an n-type transistor device, the charge carriers injected by the drain region 13 are electrons and the charge carriers injected by the body region 22 are holes. When the transistor device changes from the diode state into the (forward biased) blocking state (the fourth operating state), the charge carriers forming the charge carrier plasma have to be removed from the drift region 11 before the transistor device blocks, that is, before a current through the transistor device turns to zero. Further, in the blocking state, charge carriers are stored in junction capacitance formed by the pn-junction between the body region 22 and the drift region 11 and a pn-junction formed between the drift region 11 and the compensation region 12. Switching the superjunction transistor device from the diode state to the blocking state is associated with losses, which are usually referred to as reverse recovery losses. Basically, the larger the amount of charge carriers that are included in the drift region 11 in the diode state and the higher the voltage that is associated with charging the junction capacitance in the blocking state, the higher the reverse recovery losses.

In order to reduce reverse recovery losses, operating the superjunction transistor device in the diode state, according to one example, includes applying a bias voltage $V_{DEP}$ that is different from zero between the source node S and the compensation region 21 of at least one of the plurality of transistor cells 10 of the superjunction transistor device. As outlined in further detail herein below, a polarity of the bias voltage $V_{DEP}$ may be such that a pn-junction between the compensation region 21 and the drift region 11 is reverse biased. According to one example, applying the bias voltage $V_{DEP}$ between the source node S and the compensation region 21 includes applying the bias voltage $V_{DEP}$ between the source node S and the bias node Q that is connected to the compensation region 21.

According to one example, a magnitude of the bias voltage $V_{DEP}$ is less than 20%, less than 10%, or even less than 5% of a voltage blocking capability of the superjunction transistor device. The "voltage blocking capability" is the maximum voltage the superjunction transistor device can withstand in the blocking state between the drain node D and the source node S without being damaged. According to one example, the voltage blocking capability is between 600V and 1200V and the magnitude of the bias voltage is between 10 volts (V) and 30 volts, in particular between 15 volts and 25 volts, for example.

Referring to the above, the bias node Q may be connected to the compensation region 21 via a contact region 24. The contact region 24 is of the second doping type and more highly doped than the compensation region 21. Referring to the above, the bias voltage $V_{DEP}$ may be provided by a bias voltage source 6 and a switch 5 may be connected in series with the bias voltage source 6. The switch 5 can be activated (switched on) or deactivated (switched off) by a control signal S5. The switch 5 serves to selectively apply the bias voltage $V_{DEP}$ between the source node S and the bias node Q, wherein the bias voltage $V_{DEP}$ is applied between the source node S and the bias node Q and, therefore, between the drift region 11 and the compensation region 21 when the switch 5 is activated.

Referring to the above, the bias voltage $V_{DEP}$ is applied between the source node S and the compensation region 21 of at least one transistor cell when the transistor device is in the diode state. The bias voltage $V_{DEP}$ may also be applied between the source node S and the compensation region 21 in a transient phase in which the transistor device changes from the diode state (third state) to the blocking state (fourth state). In the example illustrated in FIG. 1, the compensation region 21 of each transistor cell 10 is connected to the bias node Q so that, when the switch 5 is activated, the bias voltage $V_{DEP}$ is applied between the source node S and the compensation region 21 of each of transistor cell 10. This, however, is only an example.

Figure 3:
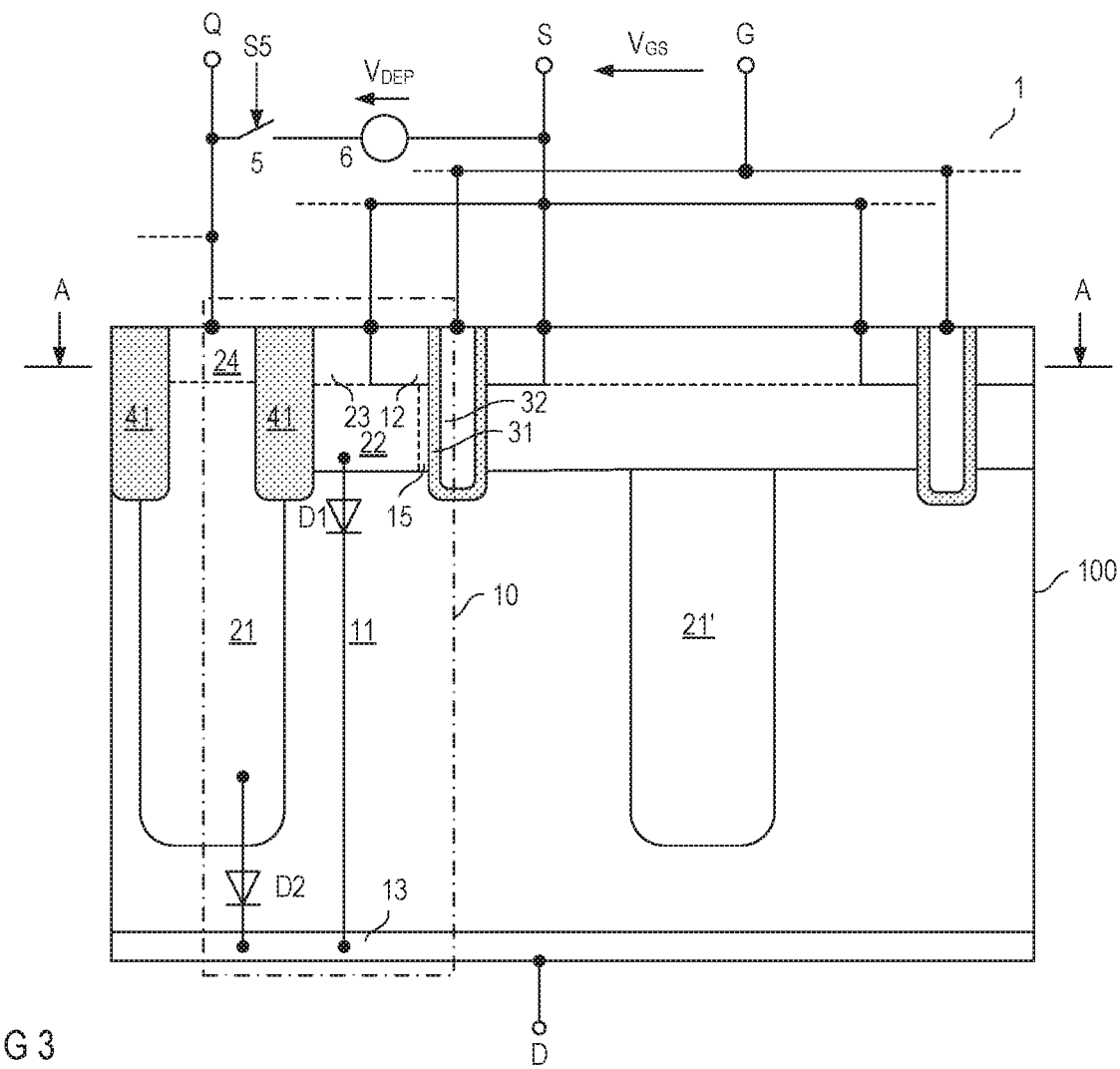
FIG. 3 shows a modification of the superjunction transistor device illustrated in FIG. 1.

FIG. 3 shows a vertical cross-sectional view of a superjunction transistor device according to another example. In this example, the transistor device includes at least one compensation region 21' that adjoins the body region 22 and is not connected to the bias node Q, while another compensation region 21 is connected to the bias node Q.

According to one example, a polarity of the bias voltage $V_{DEP}$ is such that a pn-junction between the compensation region 21 and the drift region 11 is reverse biased. In other words, a polarity of the bias voltage $V_{DEP}$ is such that an injection of charge carriers of the second conduction type from the compensation region 21 into the drift region 11 and of charge carriers of the first conduction type from the drift region 11 into the compensation region 21 is prevented. Thus, unlike a conventional superjunction transistor device, a bipolar diode formed by the compensation region 21, the optional buffer region 14 and the drain region 13 is not active (not forward biased) in the diode state, so that a concentration of the charge carrier plasma is reduced in the superjunction transistor device according to one of FIGS. 1 and 3 as compared to a conventional superjunction transistor device. Moreover, charge carriers injected (emitted) by the body region 22 in the drift region 11 are collected by the compensation region 21, which further reduces the charge carrier concentration in the drift region 11. Further, in the blocking state, the junction capacitance formed by the compensation region 21 and the drift region 11 is charged by the voltage source 6 providing the bias voltage $V_{DEP}$ before the voltage (drain-source voltage) between the drain node D and the source node S may increase to voltage levels much higher than the bias voltage $V_{DEP}$. In this way, losses associated with charging the junction capacitance are significantly lower than in a conventional device in which the drain-source voltage causes a charging of this junction capacitance.

In an n-type transistor device, a polarity of the bias voltage $V_{DEP}$ may be such that (when the electronic switch 5 is in an on-state) the electrical potential of the bias node Q is negative relative to the electrical potential at the source node S.

Figure 4A:
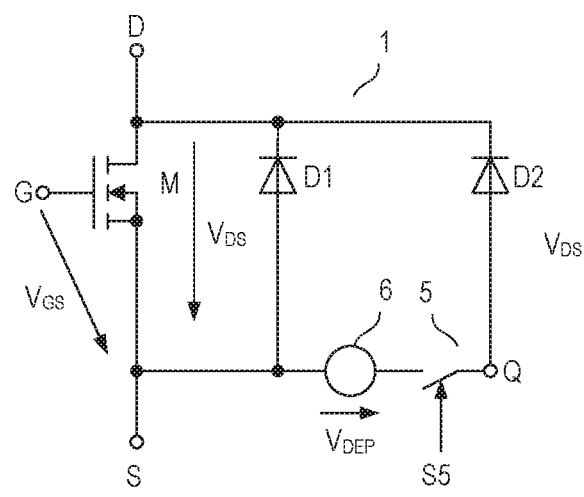
FIGS. 4A and 4B show equivalent circuit diagrams of a superjunction transistor device of the type illustrated in FIGS. 1 and 3.
Figure 4B:
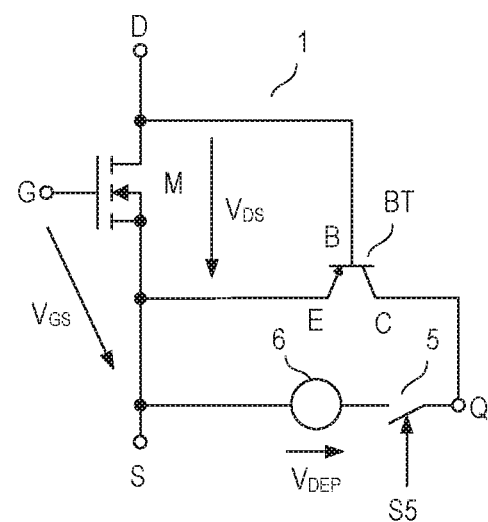

FIGS. 4A and 4B show equivalent circuit diagrams of the transistor arrangement 1 with the superjunction transistor device, the bias voltage source 6, and the switch 5. In each of these circuit diagrams, a MOSFET M represents a part of the superjunction transistor device that includes the source region 12, the body region 22, the drift region 11 and the drain region 13. Just for the purpose of illustration, the circuit symbol of the MOSFET M shown in FIGS. 4A and 4B represents an n-type enhancement MOSFET. This, however, is only an example. The principles explained in the following apply to a p-type enhancement MOSFET or to any type of depletion MOSFET as well. A first diode D1 connected between the drain node D and the source node S in the circuit diagram shown in FIG. 4A is formed by the body region 22, the drift region 11, the optional buffer region 14, and the drain region 13. A second diode D2 connected between the bias node Q and the drain node D is formed by the compensation region 21, the drift region 11, the optional buffer region 14, and the drain region 13. Based on the circuit diagram shown in FIG. 4A it becomes obvious that in the diode state, the further diode D2 is deactivated when superjunction transistor device is in the diode state and a magnitude of the bias voltage $V_{DEP}$ is greater than a magnitude of the drain-source voltage $V_{DS}$. An n-type superjunction transistor device, for example, is in the diode state when the drain-source voltage $V_{DS}$ is negative. The first diode D1 is forward biased (conducting) in this operating state. The magnitude of the drain-source voltage $V_{DS}$ is in the range of several volts, for example. When the magnitude of the bias voltage $V_{DEP}$ is greater than the magnitude of the drain-source voltage $V_{DS}$, the second diode D2 is reverse biased and, therefore, non-conducting.

Referring to the above, in the diode state, when the bias voltage $V_{DEP}$ is applied between the source node S and the bias node Q, the compensation region 21 collects charge carriers emitted by the body region 22 into the drift region 11. This aspect becomes obvious from the circuit diagram shown in FIG. 4B. According to this circuit diagram, a bipolar transistor BT has a base node B connected to the drain node D of the MOSFET M, an emitter node E connected to the source node S of the MOSFET M and a collector node C connected the bias node Q. The base B of this bipolar transistor is formed by the drift region 11, the emitter E is formed by the body region 22 and the collector C is formed by the compensation region 21 in the transistor devices shown in FIGS. 1 and 3. Based on the circuit diagram shown in FIG. 4B, it becomes obvious that when the MOSFET M is in the diode state, that is, when the drain-source voltage $V_{DS}$ reverse biases the transistor device and the conducting channel and the body region 22 is interrupted, the body region 22 that forms the emitter E of the bipolar transistor BT emits second type charge carriers into the drift region 11 that forms the base whenever the electrical potential of the drain node D (which at the same time is the base node B of the bipolar transistor BT) has a lower electrical potential than the body region 22. These second type charge carriers, however, are collected by the compensation region 21 so that mainly first type charge carriers flow to the drain region 13. Just for the purpose of illustration, it is assumed that the superjunction transistor device is an n-type transistor device. In this case, the bipolar transistor BT is a p-n-p bipolar transistor. This type of bipolar transistor is conducting when the electrical potential at the base node B is lower than the electrical potential at the emitter node E, which is true when the MOSFET M is reverse biased by the drain-source voltage $V_{DS}$.

Figure 5:
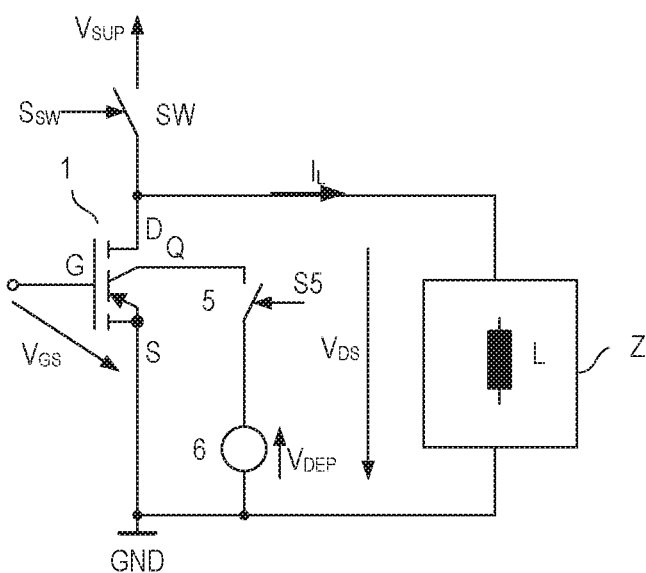
FIG. 5 illustrates one example of an electronic circuit in which the transistor device is used as a rectifier element.

FIG. 5 illustrates one example for using a transistor arrangement 1 of the type explained herein before as a rectifier element in an electronic circuit. In FIG. 5, the transistor arrangement 1 is represented by a circuit symbol that includes four circuit nodes, the gate node G, the source node S, the drain node D, and the bias node Q. This circuit symbol is a combination of the circuit symbol of a MOSFET (an n-type enhancement MOSFET in this example) and a bipolar transistor (a p-n-p-bipolar transistor in this example). The transistor arrangement 1 is connected in series with an electronic switch SW. More specifically, a drain-source path D-S (which is an internal path in the transistor arrangement 1 between the drain node D and the source node S) is connected in series with the electronic switch SW. Any type of electronic switch can be used as the electronic switch SW. According to one example, a series circuit including the electronic switch SW and the transistor arrangement 1 is connected between a first supply node and a second supply node, wherein a supply voltage $V_{SUP}$ is available between these supply nodes. Further, an inductive load Z (that is, a load that includes at least one inductor L) is connected in parallel with the drain-source path D-S of the transistor arrangement 1. In this type of circuit arrangement, the electronic switch SW serves as an electronic switch that connects the load Z to the supply voltage $V_{SUP}$ dependent on a drive signal $S_{SW}$ received by the electronic switch SW, and the transistor arrangement 1 acts as a rectifier element (or freewheeling element) that takes over a current from the inductive load Z when the switch SW switches off.

Figure 6:
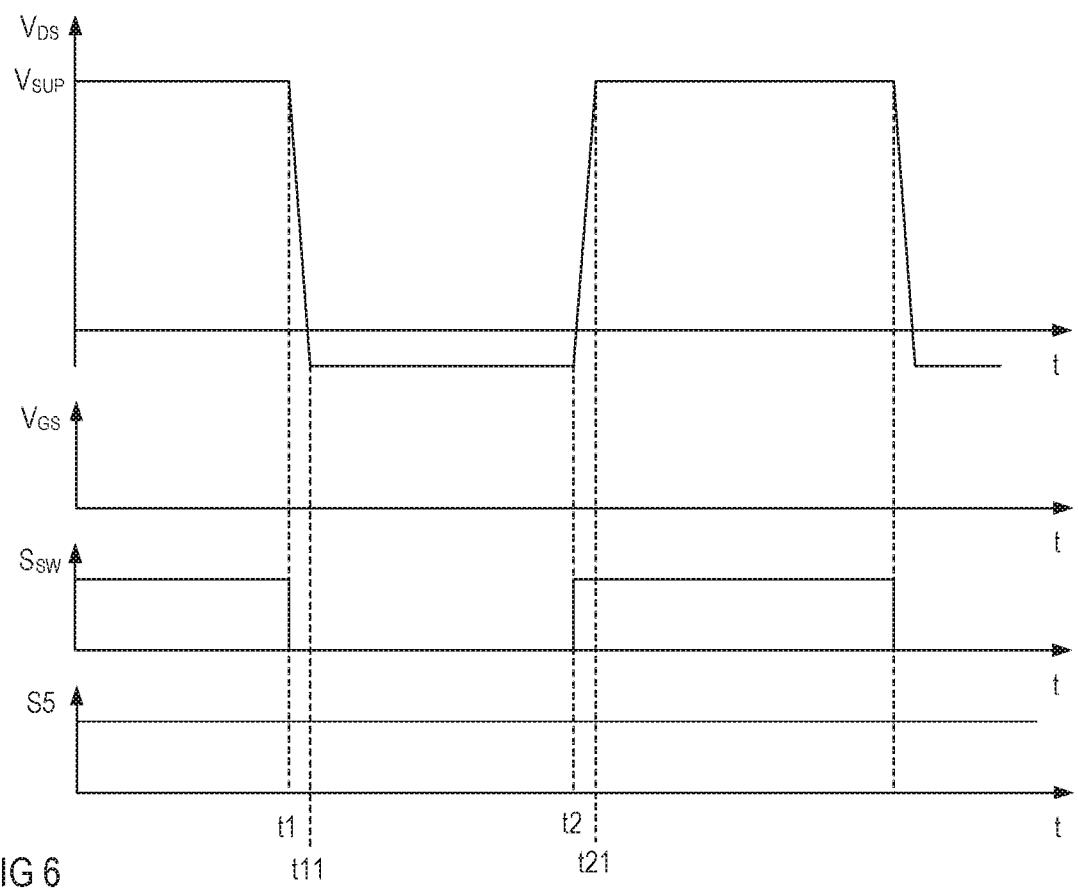
FIG. 6 shows signal waveforms that illustrate one example of a method for operating the superjunction transistor device in the electronic circuit shown in FIG. 5.

FIG. 6 shows signal diagrams that illustrate one example of operating the circuit arrangement shown in FIG. 1. More specifically, FIG. 6 shows signal waveforms of the drain-source voltage $V_{DS}$, the gate-source voltage $V_{GS}$, a control signal $S_{SW}$ of the switch SW connected in series with the transistor arrangement 1, and a control signal S5 of the switch 5 connected in series with the bias voltage source 6. Each of the control signals $S_{SW}$, S5 can have an on-level that switches on the respective switch SW, 5, or an off-level that switches off the respective switch SW, 5. Just for the purpose of illustration, the on-level is a logic high signal level and the off-level is a logic low signal level in this example.

According to one example, the transistor arrangement 1 is operated such that the gate-source voltage $V_{GS}$ is always below the threshold voltage so that the superjunction transistor device either operates in the diode state (the third operating state) or the blocking state (the fourth operating state). Just for the purpose of explanation it is assumed that the gate-source voltage $V_{GS}$ is zero in this example.

Referring to FIG. 6, the switch SW connected in series with the transistor arrangement 1 is switched on before a first time instance t1. Thus, a voltage across the load Z, which equals the drain-source voltage $V_{DS}$ of the transistor arrangement 1, essentially equals the supply voltage $V_{SUP}$ and the superjunction transistor device of the transistor arrangement 1 is in the blocking state. When the switch SW is in the on-state, a load current $I_L$ flows through the inductive load Z as indicated in FIG. 5.

When the switch SW switches off at the first time instance t1, a commutation process starts, In this commutation process, the inductive load Z forces the load current $I_L$ to flow through the transistor arrangement 1, that is, the inductive load Z reverse biases the superjunction transistor device included in the transistor arrangement 1 and operates the superjunction transistor device in the diode state. Referring to FIG. 6, the superjunction transistor device is not immediately reverse biased at the first time instance t1, but there is a transient phase between the first time instance t1 and a time instance t11 after the first time instance. In the transient phase, the operating state of the superjunction transistor device changes from the blocking state (fourth operating state) to the diode state (third operating state). During this transient phase, the drain-source voltage $V_{DS}$ changes its polarity. Referring to FIG. 6, when the electronic switch SW again switches on at a second time instance t2 (which is after the first time instance t1), the superjunction transistor device in the transistor arrangement 1 becomes forward biased and enters the blocking state so that the drain-source voltage $V_{DS}$ again increases to a voltage level that essentially equals the supply voltage level $V_{SUP}$. More specifically, there is a transient phase between the second time instance t2 and a time instance t21 after the second time instance t2. In the transient phase, the superjunction transistor device changes from the diode state (third operating state) to the blocking state (fourth operating state). During this transient phase, the drain-source voltage $V_{DS}$ again changes its polarity.

The transistor arrangement 1 may be operated such that the superjunction transistor device only changes between the diode state and the blocking state. In this case, the bias voltage $V_{DEP}$ can be applied between the source node S and the bias node Q throughout these operating states. That is, the switch 5 connected in series with the voltage source $V_{DEP}$ can permanently be switched on. Alternatively, the switch 5 is omitted and the bias voltage source 6 is permanently connected between the source node S and the bias node Q.

Figure 7A:
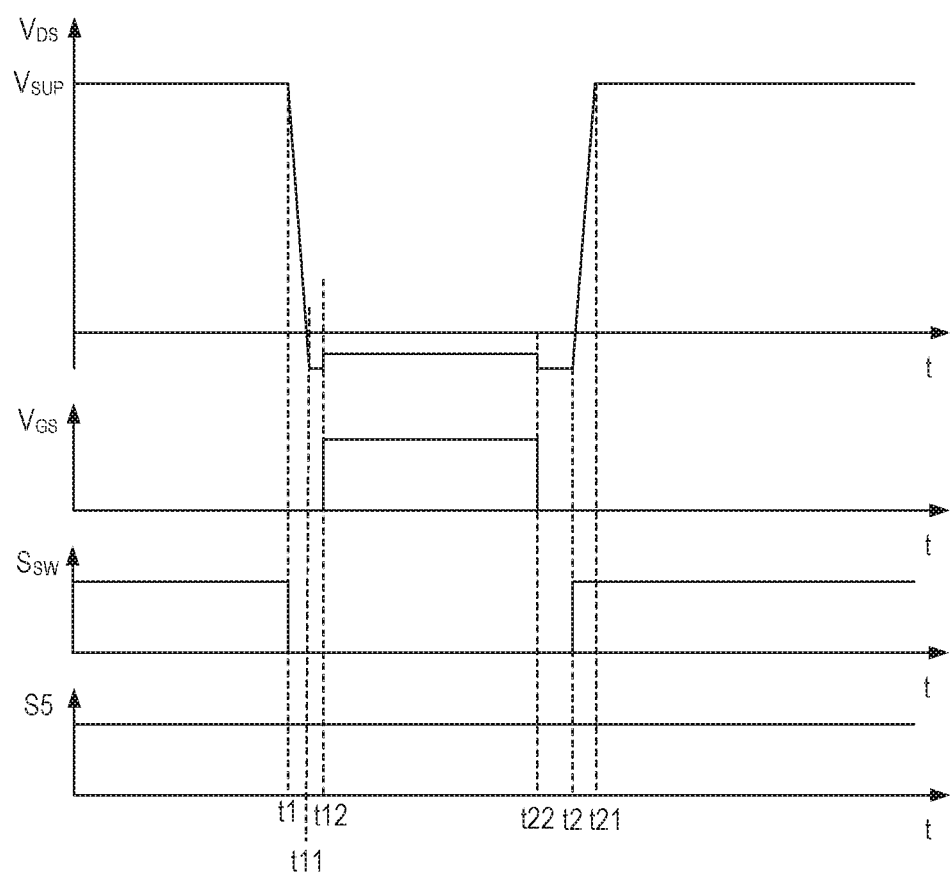
FIGS. 7A and 7B shows signal waveforms that illustrate another example of a method for operating the superjunction transistor device in the electronic circuit shown in FIG. 5.
Figure 7B:
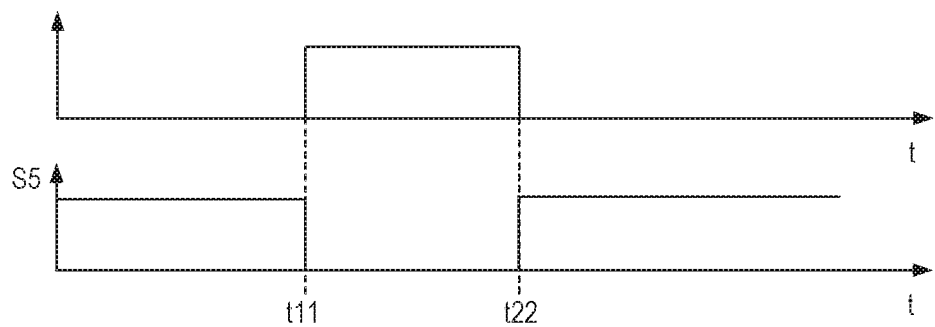

FIG. 7A illustrates a modification of the drive scheme illustrated in FIG. 6. In the example illustrated in FIG. 7, the superjunction transistor device is operated in the reverse conducting state (the second operating state) after switching off the switch SW at the first time instance t1 and before again switching on the switch SW at the second time instance t2. More specifically, there is a first dead time between the first time instance t1 and a time instance t12 when the superjunction transistor device is switched on in order to operate in the reverse conducting state, wherein this dead time may be longer than the transient phase between t1 and t11 explained above. Further, there is a dead time between a time instance t22 at which the superjunction transistor device is switched off and the second time instance t2 at which the switch SW again switches on. During these dead times, the superjunction transistor device operates in the diode state including the above referenced transient phases. Referring to FIG. 7, a magnitude of the drain-source voltage $V_{DS}$ may be lower in the reverse conducting state than in the diode state. Thus, operating the superjunction transistor device in the reverse conducting state may help to reduce conduction losses when the superjunction transistor device conducts the load current $I_L$.

Referring to FIG. 7A, the switch 5 may be switched on throughout the blocking state, the diode state and the reverse conducting state. This, however, is only an example. According to another example illustrated in FIG. 7B, the switch 5 is switched off when the superjunction transistor device is in the reverse conducting state. That is, in the example shown in FIG. 7B, the switch 5 is switched off between time instances t11 and t22. This may help to reduce conduction losses.

Figure 8A:
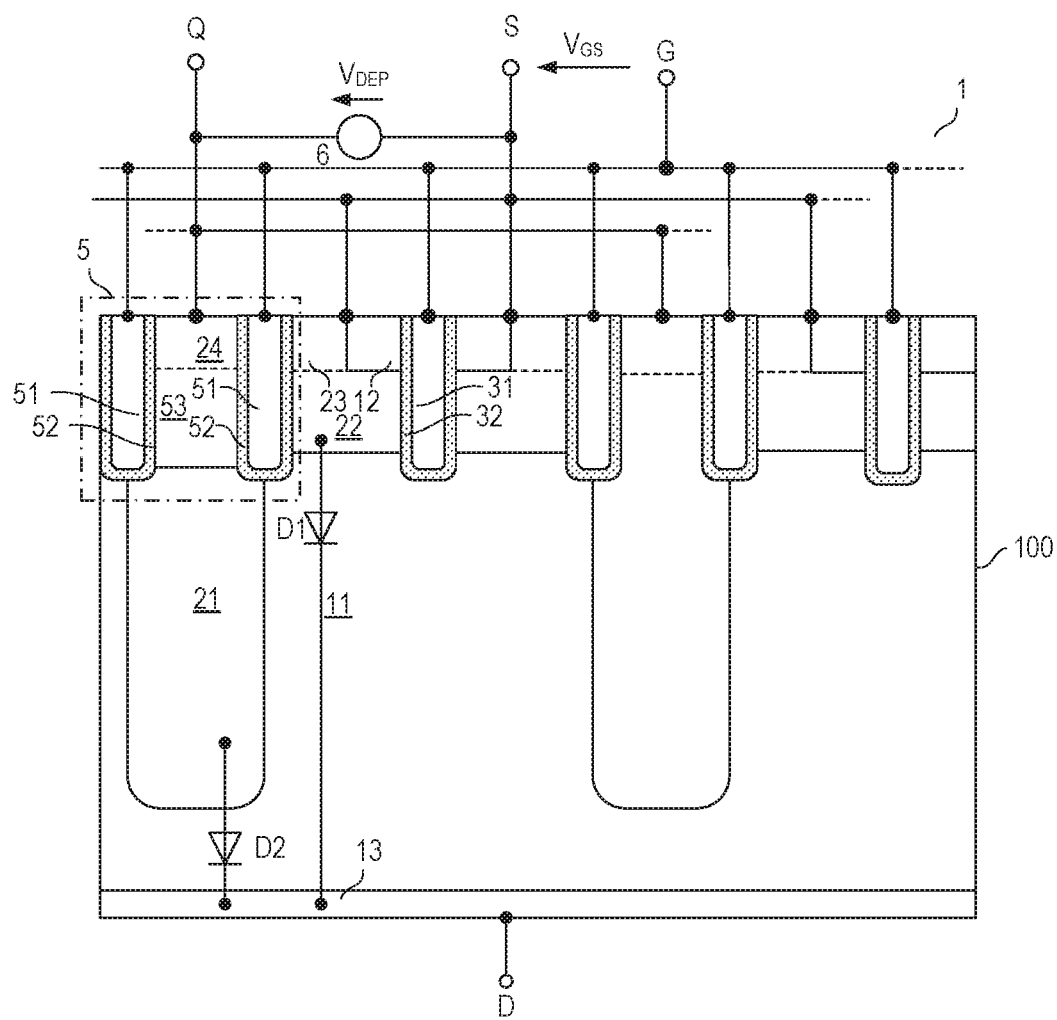
FIG. 8A illustrates one example of a superjunction transistor device and a first electronic switch that are integrated in the same semiconductor body.

FIG. 8A shows a modification of the transistor arrangement shown in FIG. 1. In the transistor arrangement 1 shown in FIG. 8A, the switch 5, that is connected between the bias voltage source 6 and the compensation region 21 is integrated in the semiconductor body 100. In this example, the switch 5 is implemented as a MOSFET, more specifically as a depletion MOSFET of the second conductivity type. This depletion MOSFET includes a body region 53 of the second doping type that is arranged between two gate electrodes 51 or between two electrode sections of one gate electrode and that is dielectrically insulated from the gate electrode 51 by a gate dielectric 52. This body region 53 adjoins the compensation region 21. At a side facing away from the compensation region 21, the body region 53 of the depletion MOSFET is connected to the bias node Q. Optionally, the contact region 24 is connected to the bias node Q and adjoins the body region 53. Further, in the superjunction transistor device shown in FIG. 8A, the arrangement with the gate dielectric 52 and the gate electrode 51 of the depletion MOSFET separates the body region 22 of the superjunction transistor device from each of the compensation region 21, the body region 53 of the depletion MOSFET, and the optional contact region 24. Thus, in the superjunction transistor device shown in FIG. 8A, the arrangement with the gate dielectric 52 and the gate electrode 51 has the same function as the insulation region 41 shown in FIG. 1.

According to one example, the gate electrode 51 of the switch 5 (more precisely, the gate electrode of the depletion MOSFET of the switch 5) is connected to the gate node G, so that the superjunction transistor device and the switch 5 are driven by the same signal.

Figure 8B:
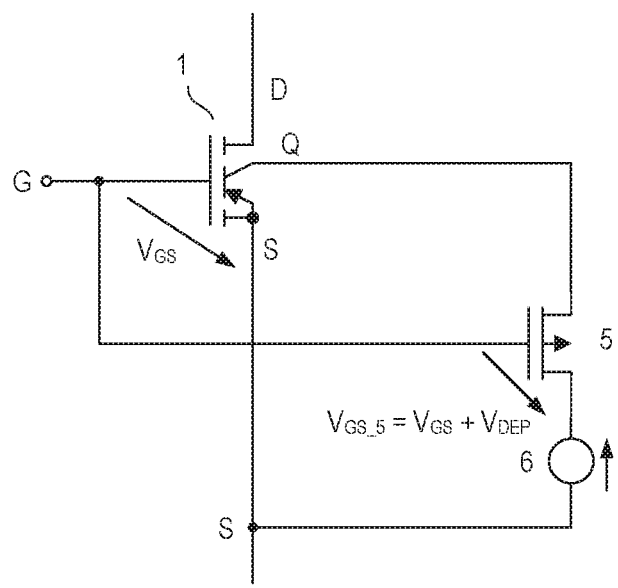
FIG. 8B shows a circuit diagram of the transistor arrangement shown in FIG. 8A.

The function of the transistor arrangement 1 shown in FIG. 8A is explained in the following. Just for the purpose of explanation it is assumed that the superjunction transistor device is an n-type transistor device, that is, the first doping type is an n-type. In this case, the MOSFET of the switch 5 is a p-type depletion MOSFET. An equivalent circuit diagram of a transistor arrangement of this type is shown in FIG. 8B, wherein in FIG. 8B the switch is only represented by the p-type depletion MOSFET.

Referring to the above, the bias voltage $V_{DEP}$ between the source node S and the bias node Q is such that the pn-junction between the compensation region 21 and the drift region 11 is reverse biased. According to one example, the superjunction transistor device and the MOSFET of the switch 5 are adapted to one another such that the switch 5 is switched off when the gate-source voltage $V_{GS}$ switches on the superjunction transistor device, that is, when the gate-source voltage $V_{GS}$ generates a conducting channel in the body region 22 of the transistor cells of the superjunction transistor device. Further, the switch 5 is switched on when the gate-source voltage $V_{GS}$ is such that the conducting channel in the body region 22 along the gate dielectric 32 is interrupted.

In the depletion MOSFET of the switch 5, the contact region 24 forms the source region and a drive voltage $V_{GS\_5}$ of this MOSFET is given by the gate-source voltage $V_{GS}$ plus the bias voltage $V_{DEP}$, that is, $V_{GS\_5}=V_{GS}+V_{DEP}$. In the example shown in FIGS. 8A and 8C, the bias voltage $V_{DEP}$ between the source node S and the bias node Q is a positive voltage, such as +20V, for example, that is referenced to the bias node Q. Thus, an electrical potential of the bias node Q is negative relative to the electrical potential at the source node S. A distance between the gate electrodes 51 and a doping concentration of the body region 53 are selected such that the body region 53 is depleted of charge carriers (so that the depletion MOSFET in the switch 5 is in an off-state) when the gate-source voltage $V_{GS}$ has a voltage level that generates the conducting channel in the body region 22 along the gate dielectric 32. The conducting channel is generated, when the voltage level of the gate-source voltage $V_{GS}$ is above the threshold voltage. The threshold voltage is between 2V and 6V, for example, when the superjunction transistor device is implemented as an enhancement device or −3V, for example, when the superjunction transistor device is a depletion device. Thus, when the superjunction transistor device is in the on-state, the drive voltage of the depletion MOSFET 5 in relation to the potential at the bias node Q is at least given by $V_{DEP}+V_{th}$, wherein $V_{th}$ is the threshold voltage of the superjunction transistor device in relation to potential at the source node S.

In order to switch on the p-type depletion MOSFET in the switch 5, its drive voltage $V_{GS\_5}$ has to be below its threshold voltage $V_{th5}$ (relatively to the potential at the bias node Q), that is, $V_{GS\_5}=V_{GS}+V_{DEP}<V_{th5}$. This is obtained, in this transistor arrangement 1, when $V_{GS}<V_{th5}-V_{DEP}$. Thus, in the transistor arrangement 1 shown in FIG. 8A, a voltage level of the gate-source voltage $V_{GS}$ of the superjunction transistor device is not only selected such that the superjunction transistor device switches on or off, but also such that the depletion MOSFET in the switch 5 switches off or on. According to one example, the depletion MOSFET in the switch 5 has a threshold voltage of 10 V. In general, the gate-source voltage $V_{GS}$ may vary between voltage levels lower than $V_{th5}-V_{DEP}$, in order to switch off the superjunction transistor device and switch on the depletion MOSFET 5, and voltage levels higher than the threshold voltage $V_{th}$ of the superjunction transistor device, in order to switch on the superjunction transistor device and switch off the depletion MOSFET.

Figure 8C:
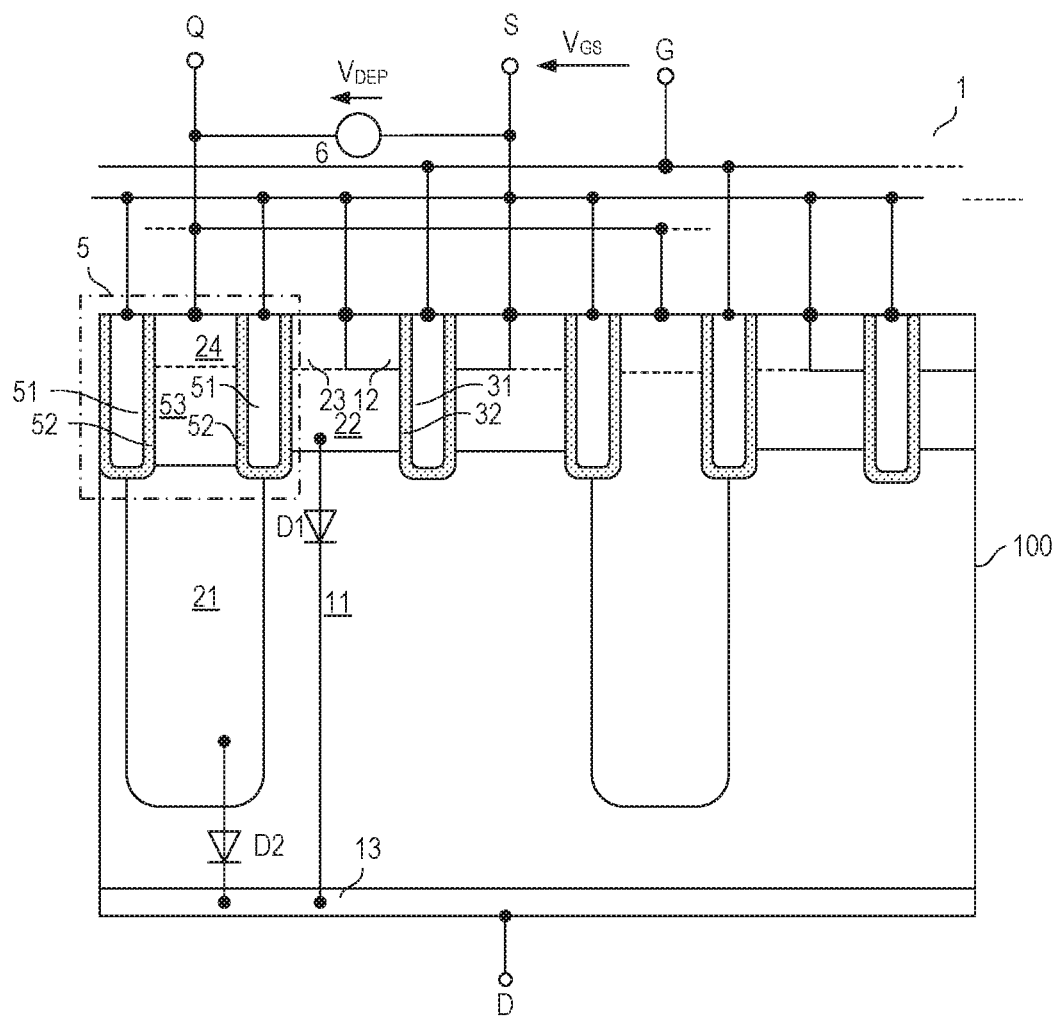
FIG. 8C illustrates a modification of the transistor device shown in FIG. 8A.

FIG. 8C shows a modification of the transistor arrangement shown in FIG. 8A. The transistor arrangement shown in FIG. 8C is different from the transistor arrangement shown in FIG. 8A in that the gate electrode 51 of the depletion MOSFET in the switch 5 is connected to the source node S instead of the gate node G.

Figure 9:
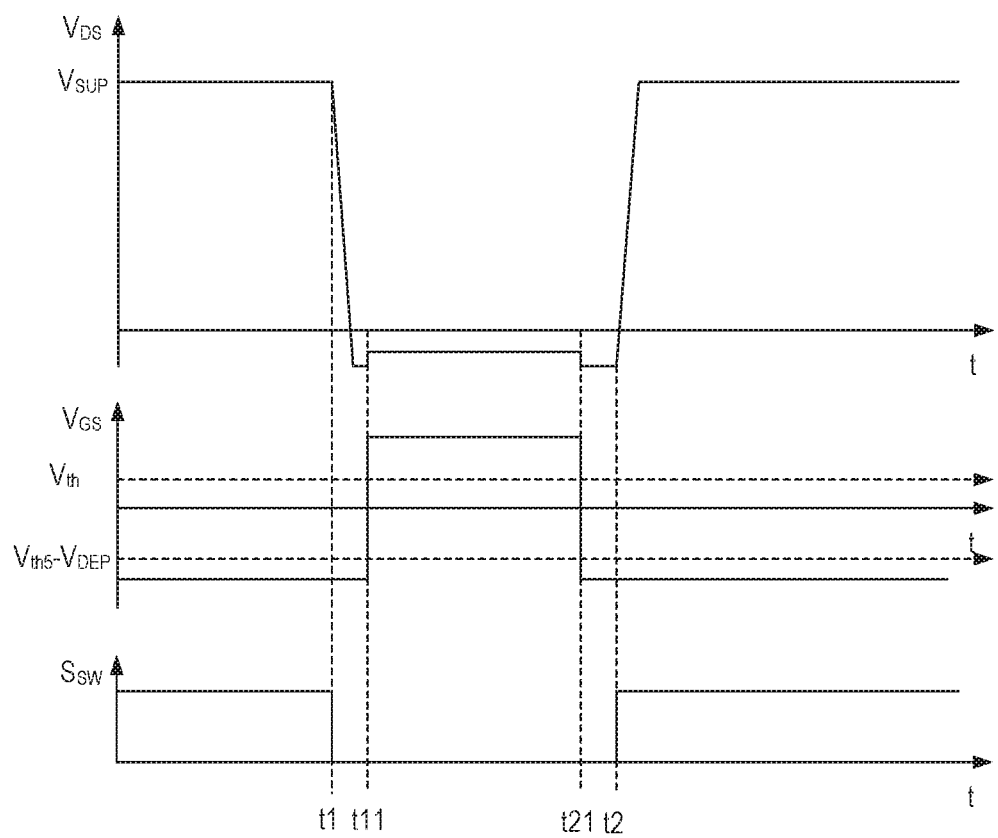
FIG. 9 shows signal waveforms that illustrate one example of a method of operating the transistor arrangement illustrated in FIG. 8 as a rectifier element in an electronic circuit of the type shown in FIG. 5.

FIG. 9 illustrates a drive scheme for driving the transistor arrangement 1 shown in FIG. 8 when used as a rectifier element in an electronic circuit of the type shown in FIG. 5. The drive scheme illustrated in FIG. 9 is based on the drive scheme illustrated in FIG. 7 and is different from the drive scheme illustrated in FIG. 7 in that the gate-source voltage $V_{GS}$ is used to drive both the superjunction transistor device and the switch 5. A signal level of the drive signal $V_{GS}$ may vary between $V_{th5}-V_{DEP}$, or lower, and a value higher than the threshold voltage of the superjunction transistor device.

Figure 10A:
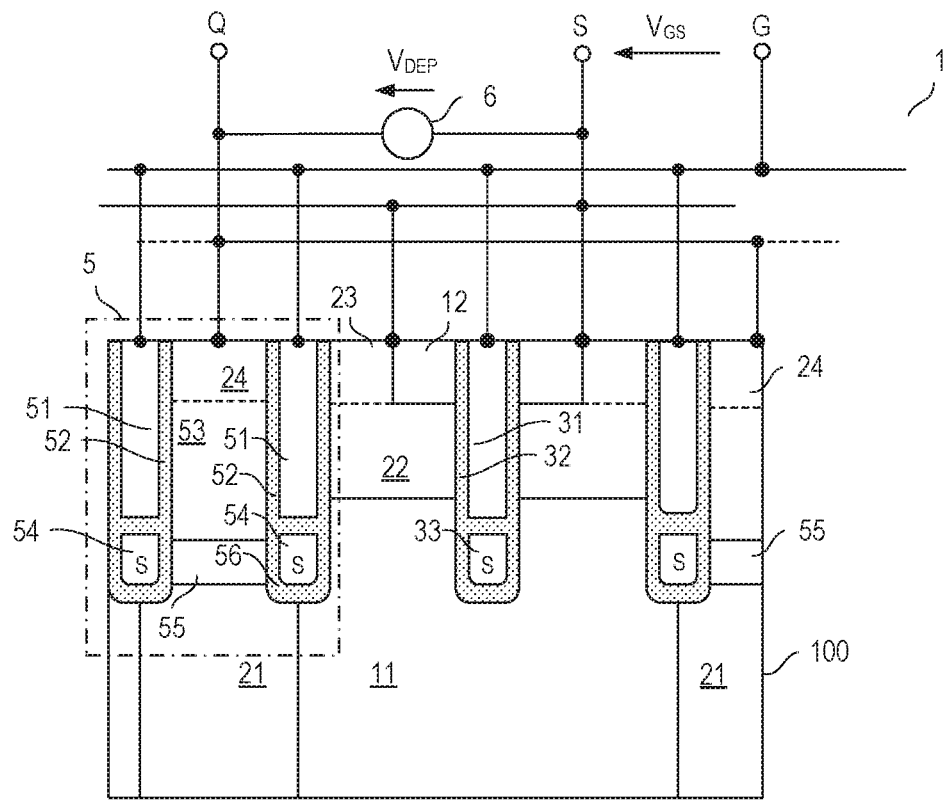
FIG. 10A shows a modification of the transistor arrangement shown in FIG. 8.

FIG. 10A shows a modification of the transistor arrangement shown in FIGS. 8A and 8C. The transistor arrangement 1 shown in FIG. 10A is different from the transistor arrangement shown in FIG. 8 in that the switch 5 includes a further depletion MOSFET with a gate electrode 54 and a body region 55 dielectrically insulated from the gate electrode 54 by a gate dielectric 56. This MOSFET is referred to as second (depletion) MOSFET in the following, and the depletion MOSFET explained with reference to FIG. 8 is referred to as first (depletion) MOSFET in the following. The body region 55 of the second MOSFET adjoins the body region 53 of the first MOSFET explained herein before. The gate electrode 54 of the second MOSFET is connected to the source node S. Connections between the gate electrode 54 and the source node S, however, are not explicitly illustrated in FIG. 10A. A doping concentration of the further body region 55 is higher than the doping concentration of the body region 53 and is selected such that the further body region 55 is completely depleted of charge carriers when the first MOSFET is in a conducting state so that the electrical potential of the body regions 53, 55 of the two MOSFETs essentially equals the electrical potential of the bias node Q, so that the drive voltage of the second MOSFET essentially equals $-V_{DEP}$.

Referring to FIG. 10A, the gate electrode 54 of the second MOSFET is adjacent the body region 55 on one side and adjacent a section of the drift region 11 on the other side. The body region 22 of the superjunction transistor device, the drift region 11 of the superjunction transistor device, the compensation region 21, and the gate electrode 54 and gate dielectric 56 of the second MOSFET form an enhancement MOSFET of the second conductivity type. By connecting the gate electrode 54 to the source node S, this enhancement MOSFET of the second conductivity type, independent of the operating state of the transistor arrangement, is in an operating state in which a conducting channel between the body region 22 and the compensation region 21, that is, a short circuit between body region 22 and the compensation region 21 is prevented. Such short circuit would be highly undesirable.

According to another example (not shown), the second MOSFET is degenerated in that the body region 55 is omitted and the gate electrodes 54 are floating.

Figure 10B:
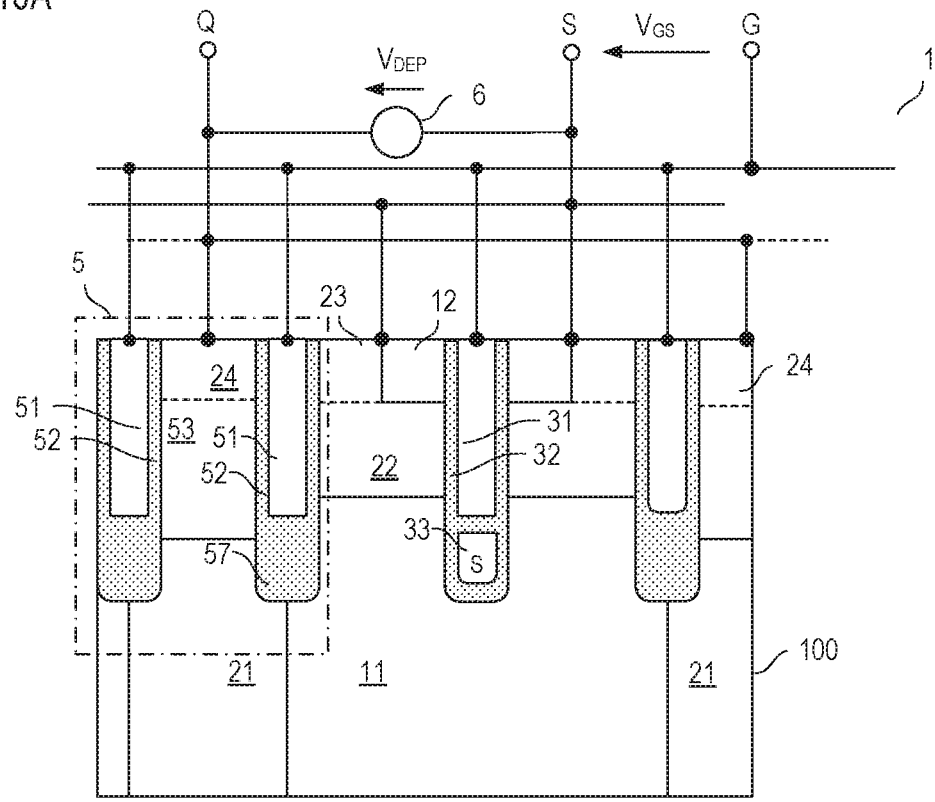
FIG. 10B shows a modification of the transistor device shown in FIG. 10A.

FIG. 10B shows a modification of the transistor device shown in FIG. 10A. The transistor device shown in FIG. 10B is different from the transistor device shown in FIG. 10A in that the second MOSFET is omitted, but a dielectric layer 57 is arranged between a bottom of the gate electrode 51 of the first MOSFET and the drift and compensation region 11, 21. A thickness of this dielectric layer is at least 10 times or at least 100 times a thickness of the gate dielectric 52.

Referring to FIGS. 10A and 10B, a field electrode 33 may be arranged below the gate electrode 31 of the superjunction transistor device in the same trench as the gate electrode 31. The field electrode 33 is dielectrically insulated from the gate electrode 31 and the drift region 11 and may be connected to the source node S. This field electrode may help to reduce the gate-drain capacitance of the superjunction transistor device.

Figure 11:
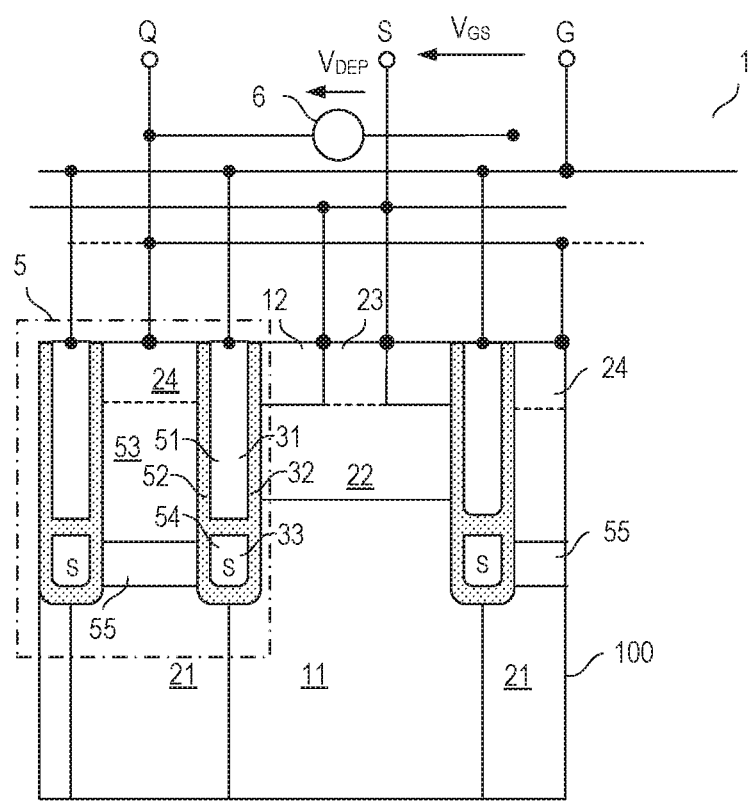
FIG. 11 shows another modification of the transistor arrangement shown in FIG. 8.

FIG. 11 shows a modification of the transistor device shown in FIG. 10A. In this example, the gate electrode 31 of the superjunction transistor device and the gate electrode of the first MOSFET of the switch 5 are formed by the same electrode. In this way, the overall transistor arrangement 1 can be implemented in a more space saving manner.

Figure 12:
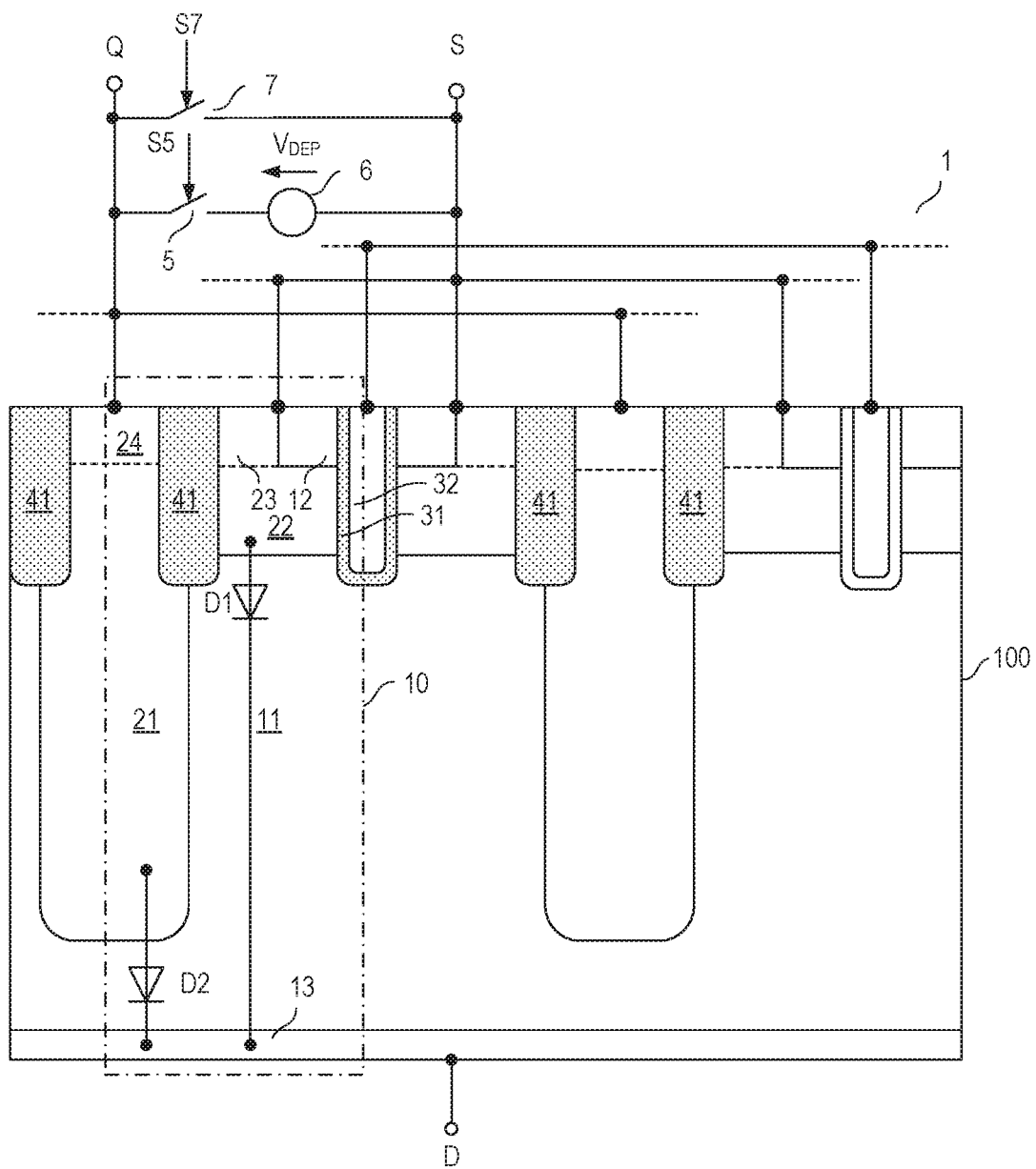
FIG. 12 illustrates a transistor arrangement with a superjunction transistor device, a first electronic switch and a second electronic switch.

FIG. 12 shows a transistor arrangement 1 according to another example. This transistor arrangement is based on the transistor arrangement shown in FIG. 1 and additionally includes a further electronic switch 7 connected between the source node S and the bias node Q in parallel to the series circuit with the bias voltage source 6 and the switch 5. In the following, the switch 5 connected in series with the bias voltage source 6 is referred to as first electronic switch and the further switch 7 is referred to as second electronic switch in the following. According to one example, the first switch and the second switch 5, 7 are driven complementary. That is, the second switch 7 switches off, when the first switch 5 switches on, and vice versa. Moreover, there may be a delay time between switching off one of the switches 5, 7 and switching on the other one of the switches 5, 7 in order to avoid a short circuit of the voltage source 6.

When the second switch 7 is switched on, the compensation region 21 is connected to the source node S. According to one example, the second switch 7 is switched on when the transistor device is in one of the channel conduction states, that is, in one of the first and second operating states in which there is a conducting channel in the body region 22 along the gate dielectric 32. When the superjunction transistor device is in the blocking state, a space charge region may expand in the drift region 11 and the compensation region 21, wherein this space charge region is associated with a charging of the compensation region 21. Switching on the second switch 7 when the superjunction transistor device changes from the blocking state to the forward conducting state or the reverse conducting state enables a discharging of the compensation region 21, wherein such discharging of the compensation region 21 helps to reduce conduction losses in the superjunction transistor device when the superjunction transistor device is in one of the forward conducting and reverse conducting state.

Figure 13A:
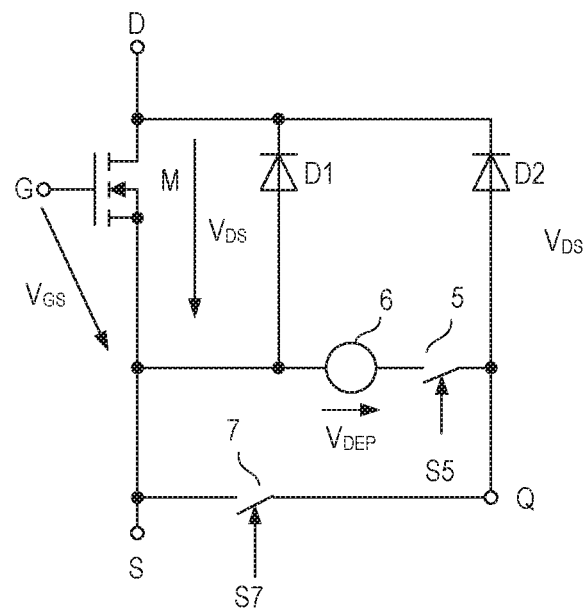
FIGS. 13A and 13B illustrate equivalent circuit diagrams of a transistor arrangement of the type shown in FIG. 12.
Figure 13B:
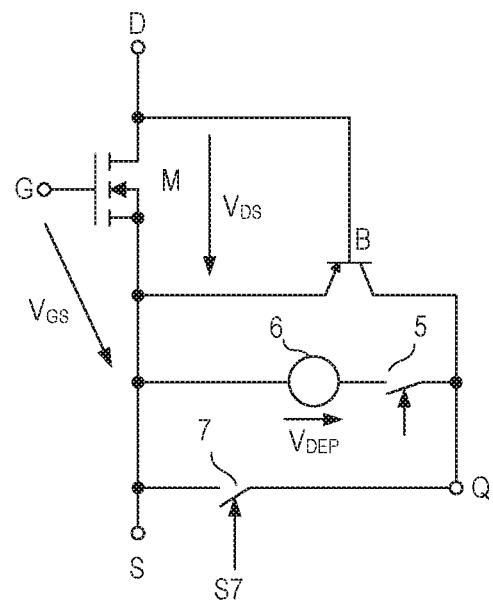

FIGS. 13A and 13B illustrate equivalent circuit diagrams of the transistor arrangement 1 shown in FIG. 12. These equivalent circuit diagrams are based on the equivalent circuit diagrams shown in FIGS. 4A and 4B and additionally include the second electronic switch 7 connected between the source node S and the bias node Q.

According to one example, the first switch 5 and the second switch 7 are integrated in the semiconductor body 100 together with the superjunction transistor device. One example of a transistor arrangement 1 of this type is illustrated in FIG. 14.

Figure 14:
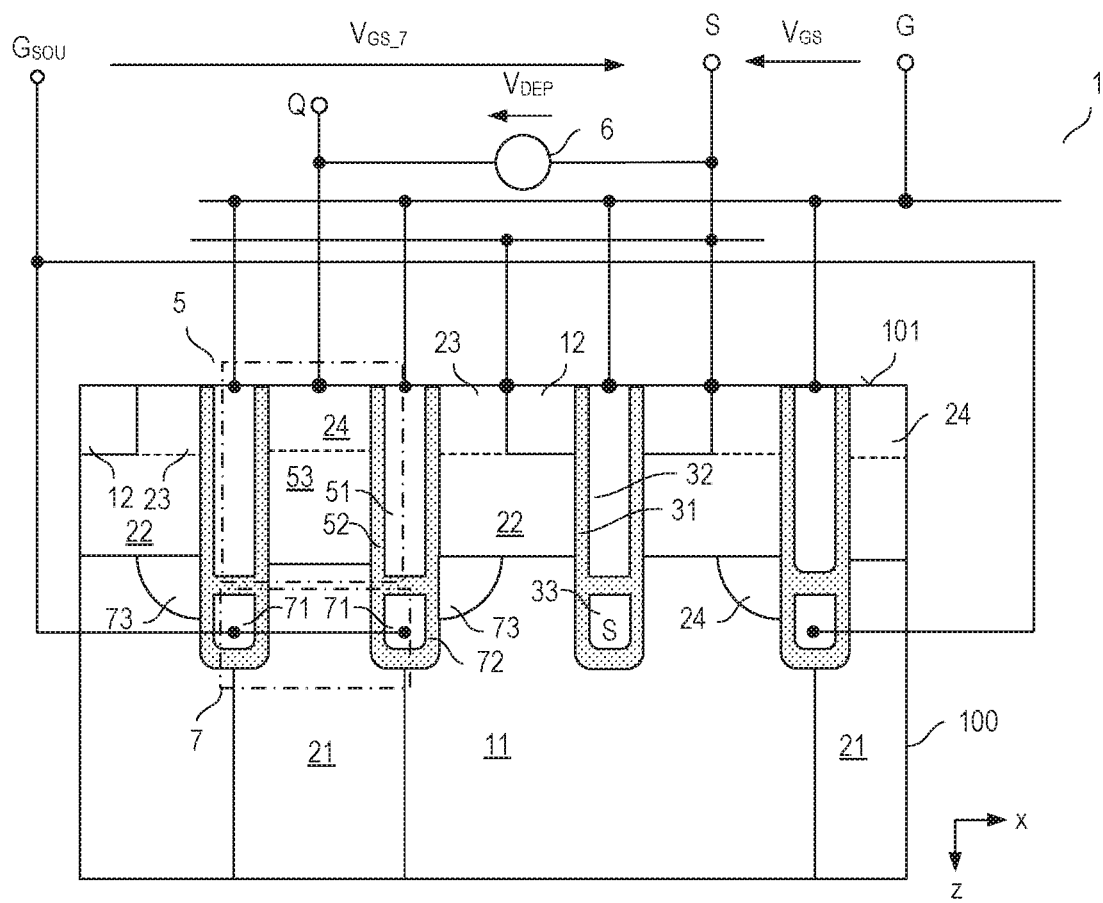
FIG. 14 illustrates one example of a transistor arrangement with a superjunction transistor device, a first electronic switch and a second electronic switch integrated in one semiconductor body.

FIG. 14 shows a vertical cross-sectional view of the semiconductor body 100, wherein the superjunction transistor device, the first switch 5 and the second switch 7 are integrated in the semiconductor body 100. In this example, the first switch 5 includes the first depletion MOSFET with the gate electrode 51, the gate dielectric 52 and the body region 53 as explained herein above, wherein the gate electrode 51 is connected to the gate node G. The second switch 7 includes a further MOSFET with a gate electrode 71 and a gate dielectric 72. According to one example, the gate electrode 71 of this MOSFET is arranged in the same trench as the gate electrode 51 of the first MOSFET, is dielectrically insulated from the gate electrode 51 of the first MOSFET and, as seen from the first surface 101 is arranged below the gate electrode 51 of the first MOSFET. The gate electrode 71 of the further MOSFET is adjacent the drift region 11 on one side in the first lateral direction x and adjacent the compensation region 21 on an opposite side. The gate electrode 71 of the further MOSFET is dielectrically insulated from both the drift region 11 and the compensation region 21 by the gate dielectric 72. In the vertical direction z, the gate electrode 71 is spaced apart from the body region 22 of the superjunction transistor device. A body region extension 73 of the second doping type adjoins the body region 22 and, in the vertical direction z, extends from the body region 22 in the drift region 11 to a vertical position of an upper end of the further gate electrode 71 or to a vertical position below this upper end of the further gate electrode 71. The "upper end" of the further gate electrode 71 is a vertical end of the further gate electrode 71 that faces the first surface 101.

Referring to FIG. 14, the further gate electrode 71 is connected to a further control node $G_{SOU}$. By suitably applying a drive voltage $V_{GS\,7}$ between this further control node $G_{SOU}$ and the source node S, the further MOSFET can be controlled such that there is a conducting channel in the drift region 11 along the gate dielectric 72 of the further MOSFET between the body region extension 73 and the compensation region 21 or such that this conducting channel is interrupted. When the drive voltage $V_{GS\,7}$ is such that there is a conducting channel along the gate dielectric 72, the compensation region 21 is electrically connected to the body region 22 and, therefore, to the source node S. The compensation region 21 is disconnected from the source node S when the conducting channel along the gate dielectric 72 is interrupted. When the superjunction transistor device is an n-type transistor device, so that the body region 22 is a p-type semiconductor region, the further MOSFET is a p-type enhancement MOSFET. In this type of MOSFET, a conducting channel along the gate dielectric 72 is generated when the drive voltage $V_{GS\,7}$ is below a negative threshold voltage. Thus, by suitably selecting the drive voltage $V_{GS\,7}$, the compensation region 21 is either connected to the source node S or disconnected from the source node S. This drive voltage $V_{GS\,7}$ is equivalent to the drive signal S7 illustrated in FIGS. 12, 13A and 13B. By providing the further control node $G_{SOU}$, the further drive voltage $V_{GS\,7}$ can be adjusted independent from the drive voltage (gate-source voltage) $V_{GS}$ of the superjunction transistor device.

Figure 15:
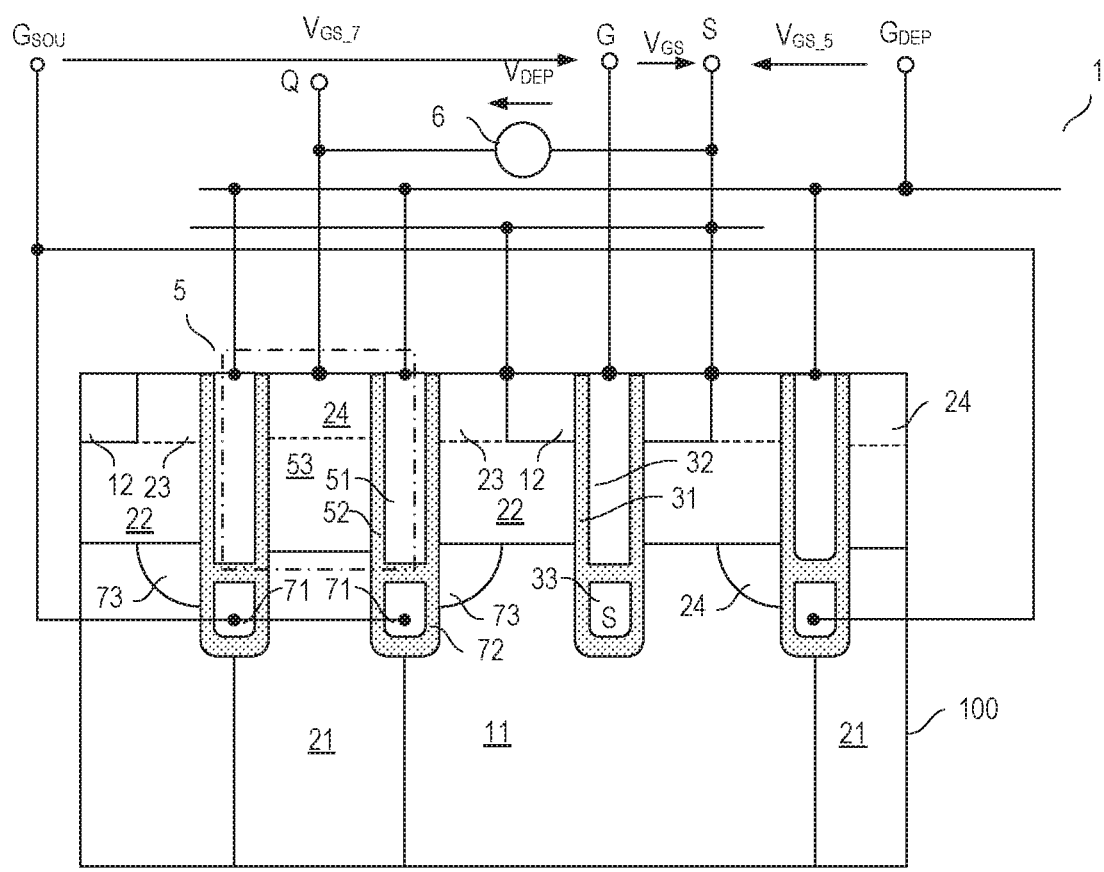
FIG. 15 shows a modification of the transistor arrangement shown in FIG. 14.

FIG. 15 shows a modification of the transistor arrangement 1 shown in FIG. 14. In this transistor arrangement 1, not only the drive voltage $V_{GS\,7}$ of the further MOSFET is independent from the gate-source voltage $V_{GS}$ of the superjunction transistor device, but also the drive voltage $V_{GS\,5}$ of the first MOSFET is independent of the gate-source voltage $V_{GS}$ of the superjunction transistor device. For this, the transistor arrangement 1 includes another control node $G_{DEP}$ which is connected to the gate electrode 51 of the first depletion MOSFET.

Figure 16:
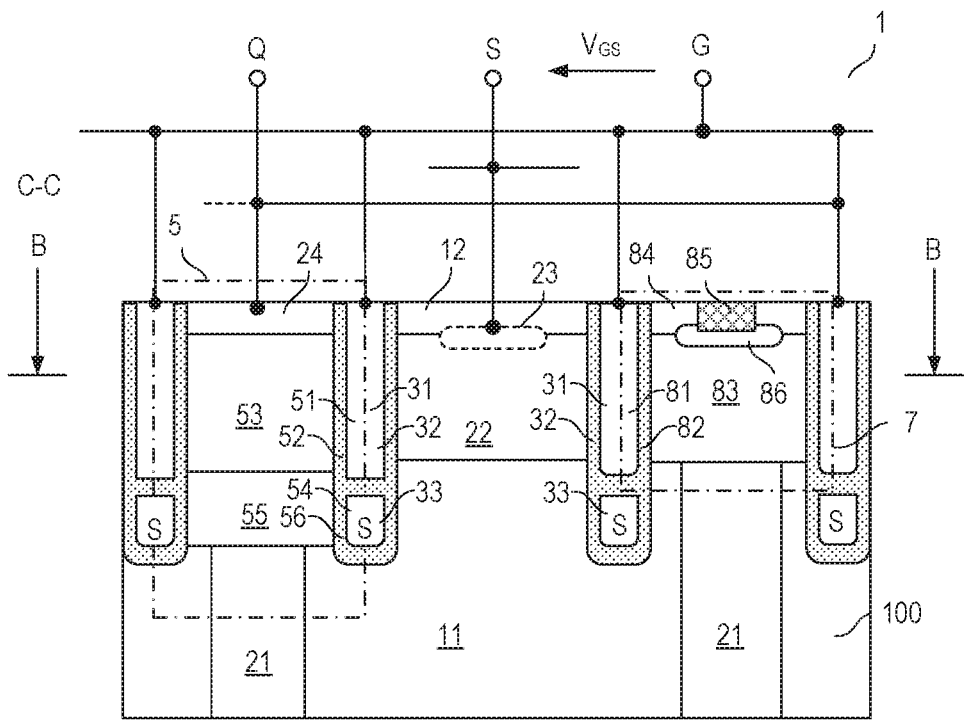
FIG. 16 shows a vertical cross-sectional view of a semiconductor body in which a superjunction transistor device, a first electronic switch and a second electronic switch are integrated.

FIG. 16 shows another example of a transistor arrangement 1 that has the superjunction transistor device, the first switch 5, and the second switch 7 integrated in the semiconductor body 100. The first switch 5 may be implemented as illustrated in FIG. 11 and include the first and second depletion MOSFET, wherein one gate electrode 31 of the superjunction transistor device and one gate electrode 51 of the first depletion MOSFET may be implemented by a common electrode (which may include a metal or polysilicon). Each of the first and second depletion MOSFET of the first switch 5 is a depletion MOSFET of the second conductivity type.

Referring to FIG. 16, the second switch 7 includes a third MOSFET. This third MOSFET is of the first conductivity type and, therefore, of the same conductivity type as the superjunction transistor device. In particular, the third MOSFET is an enhancement MOSFET of the first conductivity type. The third MOSFET includes a gate electrode 81 dielectrically insulated from a body region 83 by a gate dielectric 82. The body region 83 is of the second conductivity type and arranged between the drift region 11 and a source region 84 of the first conductivity type. Thus, the third MOSFET is an enhancement MOSFET. The superjunction transistor device, the first MOSFET of the first switch 5 and the third MOSFET of the second switch 7 are driven by the gate-source voltage $V_{GS}$ received between the gate node G and the source node S, wherein the gate electrodes 31, 51, 81 of the superjunction transistor device, the first MOSFET and the third MOSFET are connected to the gate node G. The first MOSFET is implemented such that it is in an off-state, in which the body region 53 is depleted of charge carriers, when the superjunction transistor device and the third MOSFET are in the on-state. In the on-state of the superjunction transistor device, there is a conducting channel in the body region 22 along the gate dielectric 32 between the source region 12 and the drift region 11, and in the on-state of the third MOSFET, there is a conducting channel along the gate dielectric 82 in the body region 83 between the drift region 11 and the source region 84.

Referring to the above, the second switch 7 is configured to electrically connect the source node S with the compensation region 21. For this, the second switch 7 besides the third MOSFET includes a charge carrier converter 84, 85, 86 connected to the body region 83, wherein the body region 83 adjoins the compensation region 21. When the compensation region 21 is charged and the third MOSFET is in the on-state charge carriers of the first conductivity type (which are electrons when the third MOSFET is an n-type MOSFET) can flow from the source region 84 along the conducting channel to the drift region 11. The charge carrier converter 84, 85, 86 "converts" these charge carriers of the first conductivity type into charge carriers of the second conductivity type, which are the charge carriers that can be conducted by the body region 83 to the compensation region 21. In this way, there is an electrical connection between the source node S and the compensation region 21 when the superjunction transistor device and the third MOSFET are in the on-state.

The charge carrier converter 85 includes a metal and a highly doped region 86 of the second conductivity type, wherein this doped region 86 has a higher doping concentration than the body region 83 and a highly doped region 84 of the first conductivity type. The metal 85 adjoins the source region 84 and the doped region 86 of the second conductivity type, wherein this region of the second conductivity type adjoins the body region 83.

In the transistor arrangement 1 shown in FIG. 16, each of the compensation regions 21 has the first switch 5 and the second switch 7 connected thereto, wherein the first and second MOSFET of the first switch 5 may include a plurality of transistor cells each including a gate electrode 51, 54, a gate dielectric 52, 56, and a body region 53, 55. Further, the third MOSFET of the second switch 7 may have a plurality of transistor cells each including a gate electrode 81, a gate dielectric 82 and the body region 83 and a plurality of converter cells, each including a metal 85 and a doped region 86 of the second conductivity type and a doped region 84 of the first conductivity type, wherein at least one of these transistor cells and a corresponding converter cell is connected to one compensation region 21.

Figure 17:
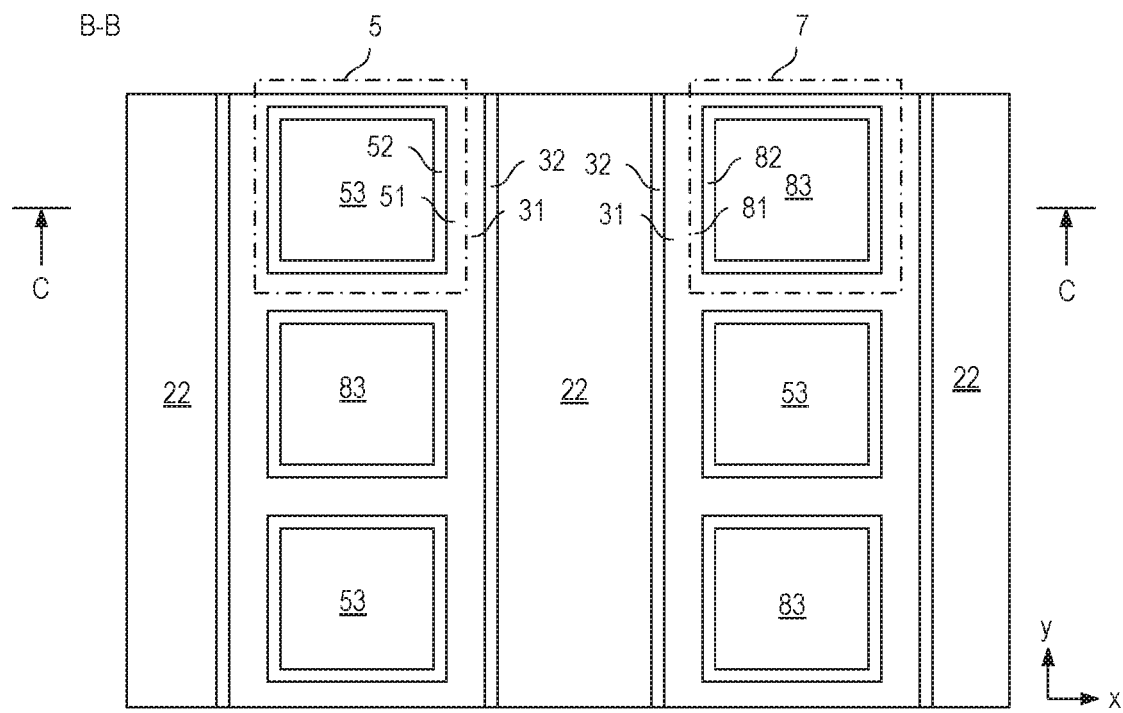
FIG. 17 shows a horizontal cross-sectional view of the transistor arrangement shown in FIG. 16.

Referring to FIG. 17, which shows a horizontal cross sectional view of the semiconductor body 100 in a section plane B-B shown in FIG. 16, a plurality of transistor cells of the first and second MOSFET and a plurality of transistor cells of the third MOSFET are connected to each compensation region 21, wherein the transistor cells of the first and second MOSFET and the transistor cells of the third MOSFET are arranged alternatingly in the longitudinal direction (which is the second lateral direction y in the example shown in FIG. 17) of each compensation region. The section plane B-B shown in FIG. 17 cuts through the body regions 53, 22 and 83 of the transistor cells of the first MOSFET, of the transistor cells of the superjunction transistor device, and of the transistor cells of the third MOSFET. The vertical cross-sectional view shown in FIG. 16 is a vertical cross sectional view in a vertical section plane C-C illustrated in FIG. 17.

In the example illustrated in FIGS. 16 and 17, the transistor cells of the first MOSFET (and the second MOSFET) and the transistor cells of the third MOSFET are arranged such that in the first lateral direction x each transistor cell of the first MOSFET (represented by the body region 53 in FIG. 17) is adjacent a transistor cell of the third MOSFET (represented by the body region 83 in FIG. 17). This, however, is only an example. According to another example illustrated in FIG. 18, the transistor cells of the first MOSFET (the second MOSFET) and the third MOSFET are arranged such that in the first lateral direction x a transistor cell of the first MOSFET is adjacent another transistor cell of the first MOSFET and a transistor cell of the third MOSFET is adjacent another transistor cell of the third MOSFET.

Figure 18:
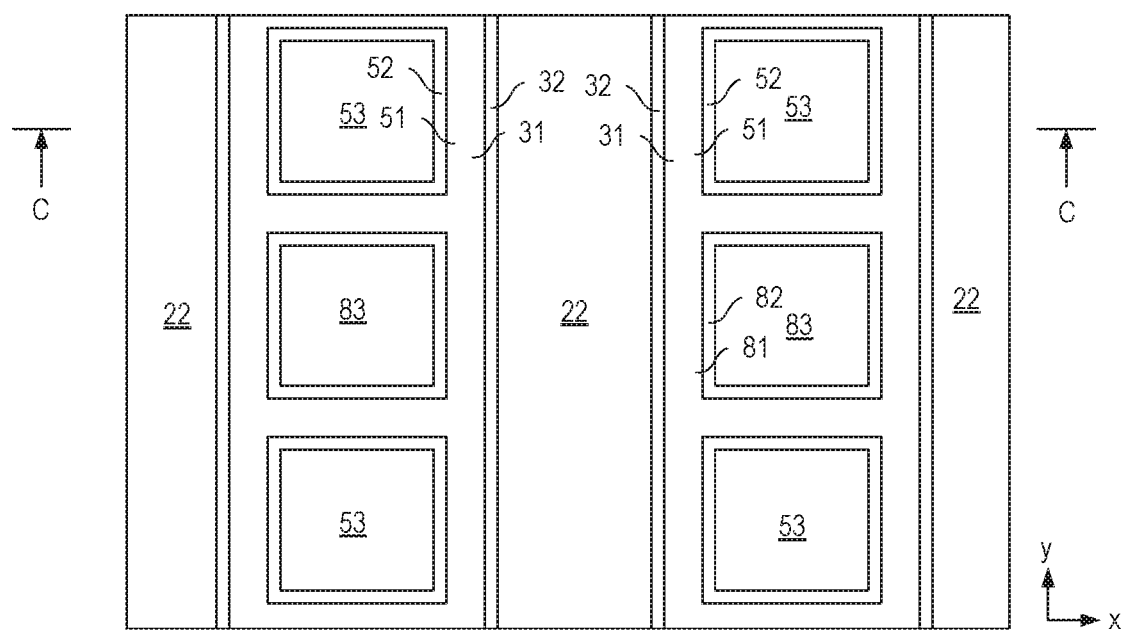
FIG. 18 shows a modification of the transistor arrangement shown in FIG. 17.
Figure 19:
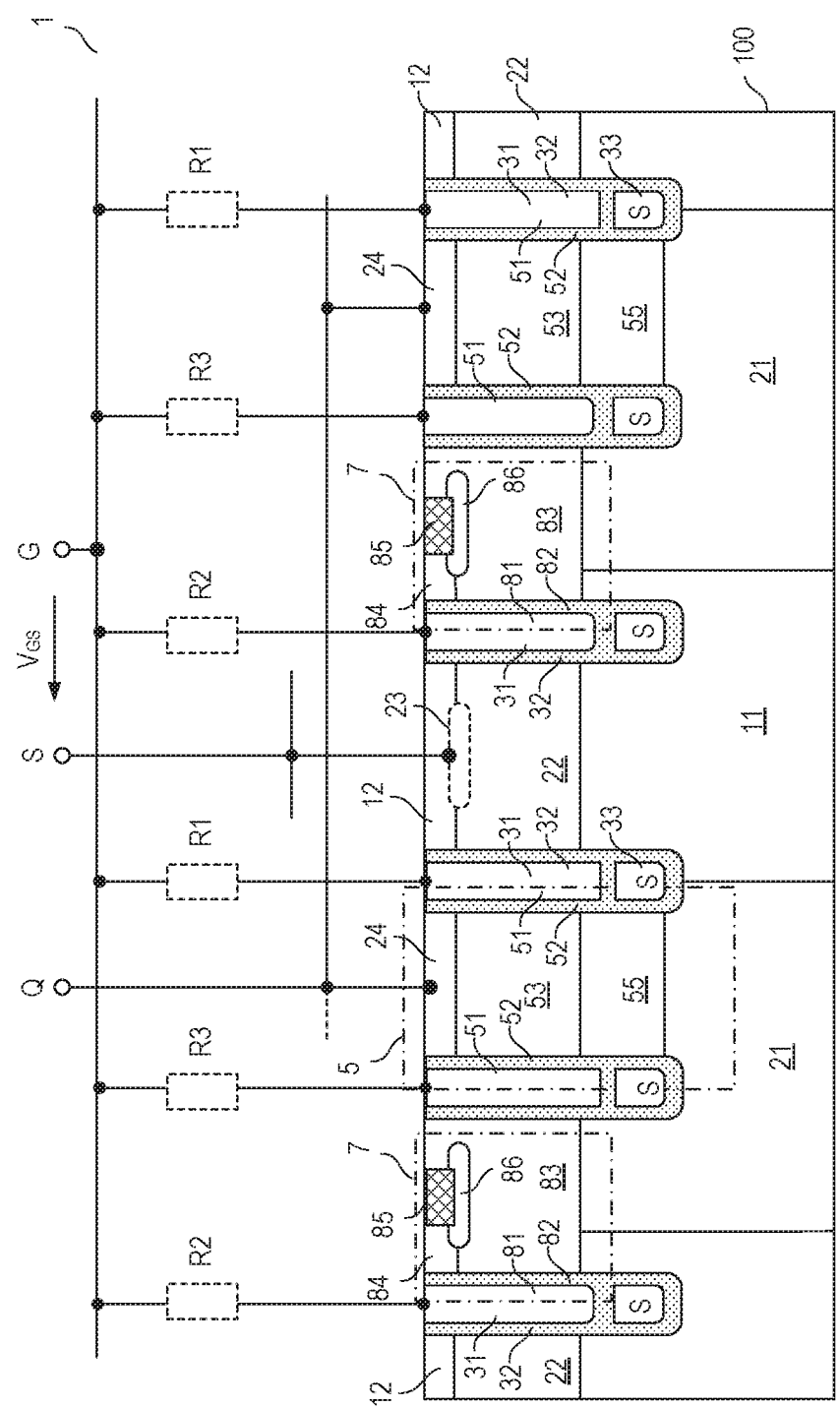
FIG. 19 shows a vertical cross-sectional view of another example of the semiconductor body in which a superjunction transistor device, a first electronic switch and a second electronic switch are integrated.

FIG. 19 shows a modification of the transistor arrangement 1 shown in FIGS. 16 to 18. In the transistor arrangement 1 shown in FIG. 19, a transistor cell of the first MOSFET (and the second MOSFET) and a transistor cell of the third MOSFET connected to one compensation region 21 are arranged next to each other in the first lateral direction x, which is the direction in which the body region 22 of the superjunction transistor device is adjacent the transistor cells of the first and third MOSFET.

According to one example, different resistors R1, R2, R3, are connected between the gate node G and the gate electrodes 31, 51, 81 of the superjunction transistor device, the first MOSFET and the third MOSFET. The resistances of these resistors may be selected such that, when the gate-source voltage of the superjunction transistor device changes, there is a delay between switching of the superjunction transistor device and at least one of the first MOSFET and the second MOSFET.

In the examples explained above, the bias voltage $V_{DEP}$ is applied between the compensation region 21 and the drift region 11 by applying the bias voltage $V_{DEP}$ between a bias node Q coupled to the compensation region 21 and the source node S coupled to the body region 22 and the source region 12. The bias node Q may be directly connected to the compensation region 21 or may be indirectly connected to the compensation region via a switch or the like. In these examples, the compensation region 21 is separated from the body region 22.

According to another example, the compensation region 21 adjoins the body region 22, so that the compensation region 21 is coupled to the source node S, and the bias voltage $V_{DEP}$ is applied between the source node S and a bias region of the second doping type, wherein the bias region adjoins the drift region 11, and wherein a polarity of the bias voltage is such that a pn-junction between the bias region 25 and the drift region 11 is forward biased and the pn-junction between the drift region 11 and the compensation region 21 is reverse biased. An example of a transistor arrangement of this type is illustrated in FIG. 20.

Figure 20:
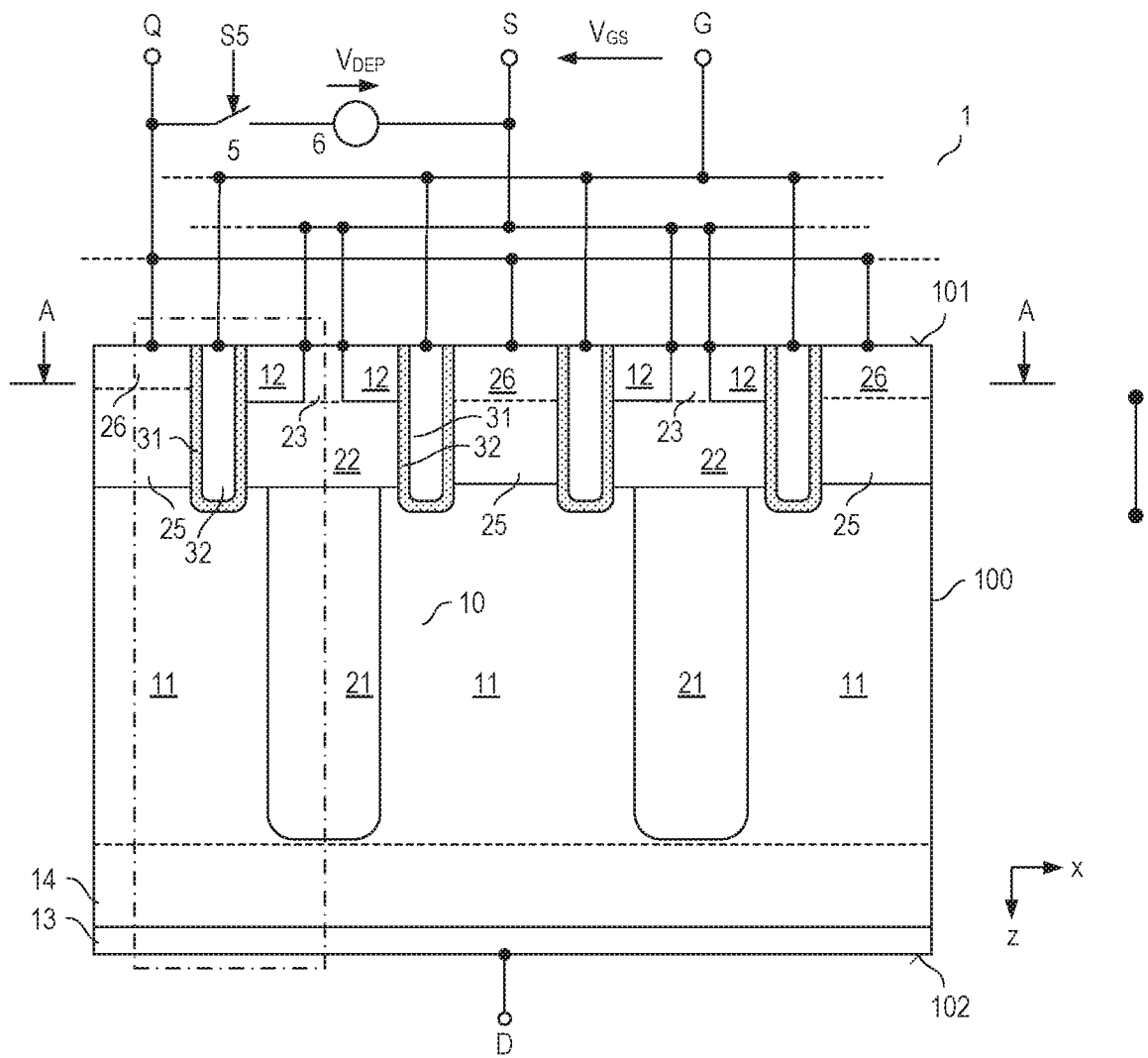
FIG. 20 shows a transistor arrangement according to another example.

The transistor arrangement shown in FIG. 20 is different from the transistor arrangements explained with reference to FIGS. 1 to 19 in that the compensation region 21 of each transistor cell 10 adjoins the body region 22 of the respective transistor cell 10. Further, the superjunction transistor device includes at least one bias region 25 of the second doping type. The at least one bias region 25 adjoins the drift region 1, is coupled to the bias node Q, and is separated from the body regions 22 of the transistor cells 10. In the example shown in FIG. 20, the bias region 25 is separated from the body region 22 of a transistor cell 10 by the gate electrode 31 and the gate dielectric 32 of the respective transistor cell 10 and by a section of the drift region 11. This, however, is only an example. Other means that separate the bias region 25 from the body regions 22, such as trenches filled with dielectrics (not shown), may be implemented as well. Optionally, the bias region 25 is connected to the bias node Q through a contact region 26 of the second doping type that is more highly doped than the bias region 25 and provides an ohmic contact between the bias node Q and the bias region 25.

In the example illustrated in FIG. 20, the bias voltage $V_{DEP}$ can be applied between the drift region 11 and the compensation region 21 by applying the bias voltage $V_{DEP}$ between the bias node Q coupled to the bias region 25 and the source node S coupled to the compensation region. Referring to FIG. 20, applying the bias voltage $V_{DEP}$ between the bias node Q and the source node S may include connecting the bias voltage source 6 between the bias node Q and the source node S.

A first switch 5 may be connected in series with the bias voltage source 6 in order to be able to selectively apply the bias voltage $V_{DEP}$ between the bias node Q and the source node S and, therefore, between the drift region 11 and the compensation region 21. The first switch 5 is connected between the voltage source 6 and the bias node Q in the example shown in FIG. 20. This, however, is only an example. The switch 5 may be implemented at any position between the voltage source 6 and the compensation region 21 or between the voltage source 6 and the bias region 25.

Referring to the above, a polarity of the bias voltage $V_{DEP}$ is such that the pn-junction between the bias region 25 and the drift region 11 is forward biased and the pn-junction between the drift region 11 and the compensation region 21 is reverse biased. As compared to the polarity of the bias voltage in the examples explained with reference to FIGS. 1 to 19 the polarity of the depletion voltage $V_{DEP}$ in the transistor arrangement shown in FIG. 20 is inverted. In a transistor arrangement with an n-type superjunction transistor device, for example, (a) the bias voltage $V_{DEP}$ is such that the source node S has a higher electrical potential than the bias node Q (that is, the bias voltage $V_{DEP}$ between the source node S and the bias node Q as referenced to the bias node Q is a positive voltage) when the transistor arrangement is implemented in accordance with one of the examples illustrated in FIGS. 1 to 19, and (b) the bias voltage $V_{DEP}$ is such that the bias node Q has a higher electrical potential than the source node S (that is, the source node S has a lower electrical potential than the bias node Q and the bias voltage $V_{DEP}$ between the source node S and the bias node Q as referenced to bias node Q is a negative voltage) when the transistor arrangement is implemented in accordance with the example illustrated in FIG. 20.

The following numbered examples briefly summarize some of the aspects explained herein before.

Example 1. A method, including: operating a superjunction transistor device in a diode state, wherein operating the superjunction transistor device in the diode state includes applying a bias voltage different from zero between a drift region of at least one transistor cell of the transistor device and a compensation region of a doping type complementary to a doping type of the drift region, wherein the compensation region adjoins the drift region, and wherein a polarity of the bias voltage is such that a pn-junction between the drift region and the compensation region is reverse biased.

Example 2. The method of example 1, wherein the compensation region is spaced apart from a body region of the at least one transistor cell, and wherein the bias voltage is applied between the compensation region and the body region.

Example 3. The method of example 1, wherein the compensation region adjoins the body region of the at least one transistor cell, wherein the bias voltage is applied between the compensation region and a bias region, wherein the bias region is of the same doping type as the compensation region, adjoins the drift region, and is spaced apart from the body region.

Example 4. The method of any one of the preceding examples, wherein operating the transistor device in the diode state further includes applying a voltage between a source node and a drain node such that a pn-junction between the body region and the drift region of the at least one transistor cell is forward biased.

Example 5. The method of any one of the preceding examples, wherein applying the bias voltage between the bias region and the drift region includes applying the bias voltage between a source node connected to the body region and the compensation region.

Example 6. The method of any one of the preceding examples, wherein the transistor device has a voltage blocking capability and wherein a magnitude of the bias voltage is less than 20% of the voltage blocking capability.

Example 7. The method of any one of the preceding examples, wherein applying the bias voltage includes providing the bias voltage by a bias voltage source and closing a first switch connected between the bias voltage source and one of the drift region and the compensation region.

Example 8. The method of example 7, wherein the first switch and the superjunction transistor device are integrated in the same semiconductor body.

Example 9. The method of example 7 or 8, wherein the superjunction transistor device is of a first conductivity type, and wherein the first switch includes at least one depletion MOSFET of a second conductivity type.

Example 10. The method of any one of the preceding examples, wherein the transistor device is a vertical transistor device that is integrated in a semiconductor body, and wherein the bias voltage is connected between the compensation region and the drift region via contacts arranged on top of a first surface of the semiconductor body.

Example 11. The method of any one of the preceding examples, further including: operating the transistor device in a reverse conducting state before operating the superjunction transistor device in the diode state, wherein operating the superjunction transistor device in the reverse conducting state includes: applying a drive potential to a gate electrode of the at least one transistor cell such that there is a conducting channel in the body region of the at least one transistor cell, and applying a voltage between the body region and the drift region that has the same polarity as in the diode state.

Example 12. The method of any one of the preceding examples, further including: operating the superjunction transistor device in a blocking state after the diode state, wherein operating the superjunction transistor device in the blocking state includes applying a drive potential to a gate electrode of the at least one transistor cell such that a conducting channel in the body region of the at least one transistor cell is interrupted, and applying a voltage between the body region and the drift region that has a polarity opposite a polarity of the voltage between the body region and the drift region in the diode state.

Example 13. The method of example 12, wherein an inductive load is connected in parallel with the transistor device and an electronic switch is connected in series with the transistor device, and wherein changing an operating state of the transistor device from the diode state to the blocking state includes changing a switching state of the electronic switch from an off-state to an on-state.

Example 14. The method of any one of examples 12 or 13, further including: operating the transistor device in one of a reverse conducting state and a forward conducting after the blocking state, wherein operating the transistor device in the reverse conducting state or the forward conducting after includes connecting the compensation region to the source node.

Example 15. The method of example 14, wherein connecting the compensation region to the source node includes closing a second switch connected between the bias region and the source node.

Example 16. The method of example 15, further including: switching off the first switch when or before switching on the second switch.

Example 17. The method of any one of examples 15 or 15, wherein the second switch and the superjunction transistor device are integrated in the same semiconductor body.

Example 18. A transistor arrangement including: a transistor device including a bias region coupled to a bias node and at least one transistor cell including a source region, a body region, and drift region; and a first electronic switch connected between the bias region and the bias node, wherein the transistor device and the first electronic switch are integrated in a common semiconductor body, wherein the second electronic switch is connected between the compensation region and the source region.

Example 19. The transistor device of example 18, further including: a second electronic switch integrated in the common semiconductor body.

Example 20. The transistor arrangement of example 18 or 19, wherein the bias region is a compensation region of at least one of the transistor cell, and wherein the compensation region is spaced apart from the body region of the at least one transistor cell.

Example 21. The transistor arrangement of example 18 or 19, wherein the at least one transistor cell further includes a compensation region, and wherein the bias region is spaced apart from the compensation region and the body region.

Example 22. The transistor arrangement of any one of examples 18 to 21, wherein the transistor device and the first electronic switch are configured to be driven by the same drive signal.

Example 23. The transistor arrangement of any one of examples 18 to 22, wherein the transistor device, the first electronic switch, and the second electronic switch are configured to be driven by the same drive signal.

Example 24. The transistor arrangement of any one of examples 19 to 23, wherein the transistor device is of a first conductivity type, wherein the first electronic switch includes at least one depletion MOSFET of a second conductivity type, and wherein the second electronic switch includes an enhancement MOSFET of the first conductivity type and a charge carrier converter connected between the enhancement MOSFET and the compensation region.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A method, comprising:
    operating a superjunction transistor device in a diode state,
    wherein operating the superjunction transistor device in the diode state comprises applying a bias voltage different from zero between a drift region of at least one transistor cell of the superjunction transistor device and a compensation region of a doping type complementary to a doping type of the drift region,
    wherein the compensation region adjoins the drift region,
    wherein a polarity of the bias voltage is such that a pn-junction between the drift region and the compensation region is reverse biased.

2. The method of claim 1, wherein the compensation region is spaced apart from a body region of the at least one transistor cell, and wherein the bias voltage is applied between the compensation region and the body region.

3. The method of claim 1, wherein the compensation region adjoins the body region of the at least one transistor cell, wherein the bias voltage is applied between the compensation region and a bias region, and wherein the bias region is of a same doping type as the compensation region, adjoins the drift region and is spaced apart from the body region.

4. The method of claim 1, wherein operating the superjunction transistor device in the diode state further comprises applying a voltage between a source node and a drain node such that a pn-junction between the body region and the drift region of the at least one transistor cell is forward biased.

5. The method of claim 1, wherein the superjunction transistor device has a voltage blocking capability, and wherein a magnitude of the bias voltage is less than 20% of the voltage blocking capability.

6. The method of claim 1, wherein applying the bias voltage comprises providing the bias voltage by a bias voltage source and closing a first switch connected between the bias voltage source and one of the drift region and the compensation region.

7. The method of claim 1, wherein the superjunction transistor device is a vertical transistor device integrated in a semiconductor body, and wherein the bias voltage is connected between the compensation region and the drift region via contacts arranged on top of a first surface of the semiconductor body.

8. The method of claim 1, further comprising:
    operating the superjunction transistor device in a reverse conducting state before operating the superjunction transistor device in the diode state,
    wherein operating the superjunction transistor device in the reverse conducting state comprises:
    applying a drive potential to a gate electrode of the at least one transistor cell such that there is a conducting channel in the body region of the at least one transistor cell; and
    applying a voltage between the body region and the drift region and that has a same polarity as in the diode state.

9. The method of claim 1, further comprising:
operating the superjunction transistor device in a blocking state after the diode state,
wherein operating the superjunction transistor device in the blocking state comprises:
applying a drive potential to a gate electrode of the at least one transistor cell such that a conducting channel in the body region of the at least one transistor cell is interrupted; and
applying a voltage between the body region and the drift region that has a polarity opposite a polarity of the voltage between the body region and the drift region in the diode state.

10. The method of claim 9, wherein an inductive load is connected in parallel with the superjunction transistor device and an electronic switch is connected in series with the superjunction transistor device, and wherein changing an operating state of the superjunction transistor device from the diode state to the blocking state comprises changing a switching state of the electronic switch from an off-state to an on-state.

11. The method of claim 9, further comprising:
operating the superjunction transistor device in one of a reverse conducting state and a forward conducting state after the blocking state,
wherein operating the superjunction transistor device in the reverse conducting state or the forward conducting comprises connecting the compensation region to a source node.

12. A transistor arrangement, comprising:
a transistor device comprising a bias region coupled to a bias node and at least one transistor cell comprising a source region, a body region, a compensation region, and a drift region; and
a first electronic switch connected between the bias region and the bias node,
wherein the transistor device and the first electronic switch are integrated in a common semiconductor body,
wherein the bias node is different from a source node and a gate node of the transistor arrangement,
wherein the bias node is configured such that a bias voltage between the bias node and the source node will reverse bias a pn-junction between the compensation region and the drift region when the transistor device is in a diode state.

13. The transistor arrangement of claim 12, further comprising:
a second electronic switch integrated in the common semiconductor body,
wherein the second electronic switch is connected between the compensation region and the source region.

14. The transistor arrangement of claim 12, wherein the bias region is the compensation region, and wherein the compensation region is spaced apart from the body region of the at least one transistor cell.

15. The transistor arrangement of claim 12, wherein the bias region is spaced apart from the compensation region and the body region.

16. The transistor arrangement of claim 12, wherein the compensation region is coupled to the bias node.

17. The transistor arrangement of claim 12, wherein the bias region is connected to the bias node through a contact region that is more highly doped than the bias region and that provides an ohmic contact between the bias node and the bias region.

18. The transistor arrangement of claim 12, wherein the first electronic switch is connected between a voltage source and the bias node.

19. The transistor arrangement of claim 12, wherein the bias region is separated from the body region by a gate electrode and a gate dielectric of the at least one transistor cell and by a section of the drift region.

20. The transistor arrangement of claim 12, wherein the bias region is separated from the body region by a trench filled with a dielectric.

* * * * *